(12) United States Patent
Ong et al.

(10) Patent No.: US 8,411,497 B2
(45) Date of Patent: Apr. 2, 2013

(54) METHOD AND SYSTEM FOR PROVIDING A MAGNETIC FIELD ALIGNED SPIN TRANSFER TORQUE RANDOM ACCESS MEMORY

(75) Inventors: Adrian E. Ong, Pleasanton, CA (US); Xueti Tang, Fremont, CA (US)

(73) Assignee: Grandis, Inc., San Jose, CA (US)

( * ) Notice: Subject to any disclaimer, the term of this patent is extended or adjusted under 35 U.S.C. 154(b) by 292 days.

(21) Appl. No.: 12/774,703

(22) Filed: May 5, 2010

(65) Prior Publication Data
US 2011/0273928 A1 Nov. 10, 2011

(51) Int. Cl.
*G11C 11/14* (2006.01)
(52) U.S. Cl. ........ 365/171; 365/148; 365/158; 365/172; 977/933; 977/935
(58) Field of Classification Search .................. 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 428/810–816, 817–825.1, 428/826; 483/3; 977/933–935
See application file for complete search history.

(56) References Cited

U.S. PATENT DOCUMENTS

| | | | |
|---|---|---|---|
| 5,480,694 A | 1/1996 | Daimon et al. | |
| 6,211,090 B1 | 4/2001 | Durlam et al. | |
| 6,545,906 B1 | 4/2003 | Savtchenko et al. | |
| 6,603,677 B2 | 8/2003 | Redon et al. | |
| 6,611,405 B1 | 8/2003 | Inomata et al. | |
| 6,714,444 B2 | 3/2004 | Huai et al. | |
| 7,006,375 B2 | 2/2006 | Covington | |
| 7,502,249 B1 | 3/2009 | Ding | |
| 7,532,505 B1 | 5/2009 | Ding | |
| 2002/0036919 A1 | 3/2002 | Daughton et al. | |
| 2002/0105827 A1 | 8/2002 | Redon et al. | |
| 2002/0140060 A1 | 10/2002 | Asao et al. | |
| 2002/0149962 A1 | 10/2002 | Horiguchi | |
| 2004/0246775 A1 | 12/2004 | Covington | |
| 2005/0106810 A1 | 5/2005 | Pakala et al. | |
| 2007/0025029 A1* | 2/2007 | Hayakawa et al. | 360/324.2 |
| 2007/0285975 A1* | 12/2007 | Kawahara et al. | 365/158 |

OTHER PUBLICATIONS

IBM Journal of Research & Development vol. 50 No. 1 (Jan. 31, 2006), pp. 69-79, Single-Domain Model for Toggle MRAM, by D.C.Worledge.
IBM Journal of Research & Development vol. 50 No. 1 (Jan. 31, 2006), pp. 81-100, Spin Angular Momentum Transfer in Current-Perpendicular Nanomagnetic Junctions, by J.Z. Sun.

(Continued)

*Primary Examiner* — Harry W Byrne
(74) *Attorney, Agent, or Firm* — Convergent Law Group LLP

(57) ABSTRACT

A method and system for providing a magnetic memory are described. The method and system include providing magnetic storage cells, bit lines coupled with the magnetic storage cells, preset lines, and word lines coupled with the magnetic storage cells. Each magnetic storage cell includes magnetic element(s). The bit lines drive write current(s) through selected storage cell(s) of the magnetic storage cells to write to the selected storage cell(s). The preset lines drive preset current(s) in proximity to but not through the selected storage cell(s). The preset current(s) generate magnetic field(s) to orient the magnetic element(s) of the selected storage cell(s) in a direction. The word lines enable the selected storage cell(s) for writing. Either the bit lines reside between the preset lines and the storage cells or the preset lines reside between the storage cells and on a storage cell side of the bit lines.

27 Claims, 17 Drawing Sheets

OTHER PUBLICATIONS

IBM Journal of Research & Development vol. 50 No. 1 (Jan. 31, 2006), pp. 101-110, Spintronics—A Retrospective and Perspective, by S.A. Wolf, et al.

IBM Journal of Research & Development vol. 50 No. 1 (Jan. 31, 2006), pp. 25-39, Design Considerations for MRAM, by T.M. Maffitt et al.

J.Z. Sun, et al., Spin Angular Momentum Transfer in a Current-Perpendicular Spin-Valve Nanomagnet, Proc. SPIE vol. 5359, 445 (2004).

J.C. Slonczewski, Current-driven Excitation of Magnetic Multilayers, Journal of Magnetism and Magnetic Materials, 159 (1996) L1-L7.

PCT International Search Report and Written Opinion of the International Searching Authority issued Sep. 28, 2008, application No. PCT/US07/15987.

\* cited by examiner

METHOD AND SYSTEM FOR PROVIDING A MAGNETIC FIELD ALIGNED SPIN TRANSFER TORQUE RANDOM ACCESS MEMORY

GOVERNMENT RIGHTS

This invention was made with U.S. Government support under Grant/Contract No. HR0011-09-C-0023 awarded by the DARPA. The U.S. Government retains certain rights in this invention. Distribution authorized to U.S. Government Agencies only.

BACKGROUND OF THE INVENTION

Spin transfer based Magnetic Random Access Memory (MRAM) is a second generation MRAM technology that may offer the advantages of the first generation MRAM without the drawbacks of poor scalability and high write current. For example, FIGS. 1-2 depict a portion of a conventional spin transfer torque magnetic random access memory (STT-RAM). FIG. 1 depicts a small portion of the STT-RAM 1 including a storage cell 10. The conventional STT-RAM 1 includes a conventional magnetic storage cell 10 including a magnetic element 12 and a selection device 14. The selection device 14 is generally a transistor such as a NMOS transistor and includes a drain 11, a source 13, and a gate 15. Also depicted are a word line 16, a bit line 18, and source line 20. The word line 16 is oriented perpendicular to the bit line 18. The source line 20 is typically either parallel or perpendicular to the bit line 18, depending on specific architecture used for the conventional STT-RAM 1. The bit line 18 is connected to the magnetic element 12, while the source line 20 is connected to the source 13 of the selection device 14. The word line 16 is connected to the gate 15. FIG. 2 depicts the magnetic element 12. The magnetic element 12 includes an anti-ferromagnetic (AFM) layer 30, a pinned or reference layer 32, a nonmagnetic spacer layer 34, and a free layer 36. The AFM layer 30 is used to pin the magnetization 33 of the reference layer 32. The reference layer 32 may be a multilayer such as a synthetic antiferromagnet (SAF). The spacer layer 34 may be a conductor, such as Cu or an insulating tunneling barrier layer, such as crystalline MgO. The free layer has a magnetization 37 that may be switched.

The conventional STT-RAM 1 programs the magnetic memory cell 10 by driving a bi-directional current through the cell 10. In particular, the magnetic element 12 is configured to be changeable between a high resistance state (free layer magnetization 37 antiparallel to pinned layer magnetization 33) and a low resistance state (free layer magnetization 37 parallel to pinned layer magnetization 33) by a current flowing through the conventional magnetic element 12. When a current having a sufficiently large current density is passed perpendicular to plane, a torque sufficient to switch the magnetization 37 is generated. Typically, the requisite current density is achieved by ensuring that the magnetic element 12 ha a sufficiently small cross-sectional area as well as other features desirable for switching using the spin transfer effect.

Although the conventional STT-RAM 1 functions, one of ordinary skill in the art will readily recognize that the STT-RAM 1 is still desired to be improved.

BRIEF SUMMARY OF THE INVENTION

A method and system for providing a magnetic memory are described. The method and system include providing a plurality of magnetic storage cells, a plurality of bit lines coupled with the plurality of magnetic storage cells, a plurality of preset lines, and a plurality of word lines coupled with the plurality of magnetic storage cells. Each of the plurality of magnetic storage cells includes at least one magnetic element. The plurality of bit lines are configured to drive write current(s) through selected storage cell(s) of the plurality of magnetic storage cells to write to the selected storage cell(s). The plurality of preset lines drive preset current(s) in proximity to but not through the selected storage cell(s). The preset current(s) generate magnetic field(s) to orient the magnetic element(s) of the selected storage cell(s) in a direction. The plurality of word lines are and configured to enable the selected storage cell(s) for writing. Either the bit lines reside between the preset lines and the storage cells or the preset lines reside between the storage cells and on a storage cell side of the bit lines.

According to the method and system disclosed herein, the present invention provides a magnetic memory which may have faster write times and smaller write currents.

DETAILED DESCRIPTION OF THE INVENTION

The present invention relates to magnetic memories. The following description is presented to enable one of ordinary skill in the art to make and use the invention and is provided in the context of a patent application and its requirements. Various modifications to the preferred embodiments and the generic principles and features described herein will be readily apparent to those skilled in the art. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein. Further, for clarity, the drawings are not to scale A method and system for providing a magnetic memory are described. The method and system include providing a plurality of magnetic storage cells, a plurality of bit lines coupled with the plurality of magnetic storage cells, a plurality of preset lines, and a plurality of word lines coupled with the plurality of magnetic storage cells. Each of the plurality of magnetic storage cells includes at least one magnetic element. The plurality of bit lines are configured to drive write current(s) through selected storage cell(s) of the plurality of magnetic storage cells to write to the selected storage cell(s). The plurality of preset lines drive preset current(s) in proximity to but not through the selected storage cell(s). The preset current(s) generate magnetic field(s) to orient the magnetic element(s) of the selected storage cell(s) in a direction. The plurality of word lines are and configured to enable the selected storage cell(s) for writing. Either the bit lines reside between the preset lines and the storage cells or the preset lines reside between the storage cells and on a storage cell side of the bit lines.

Figure 3:
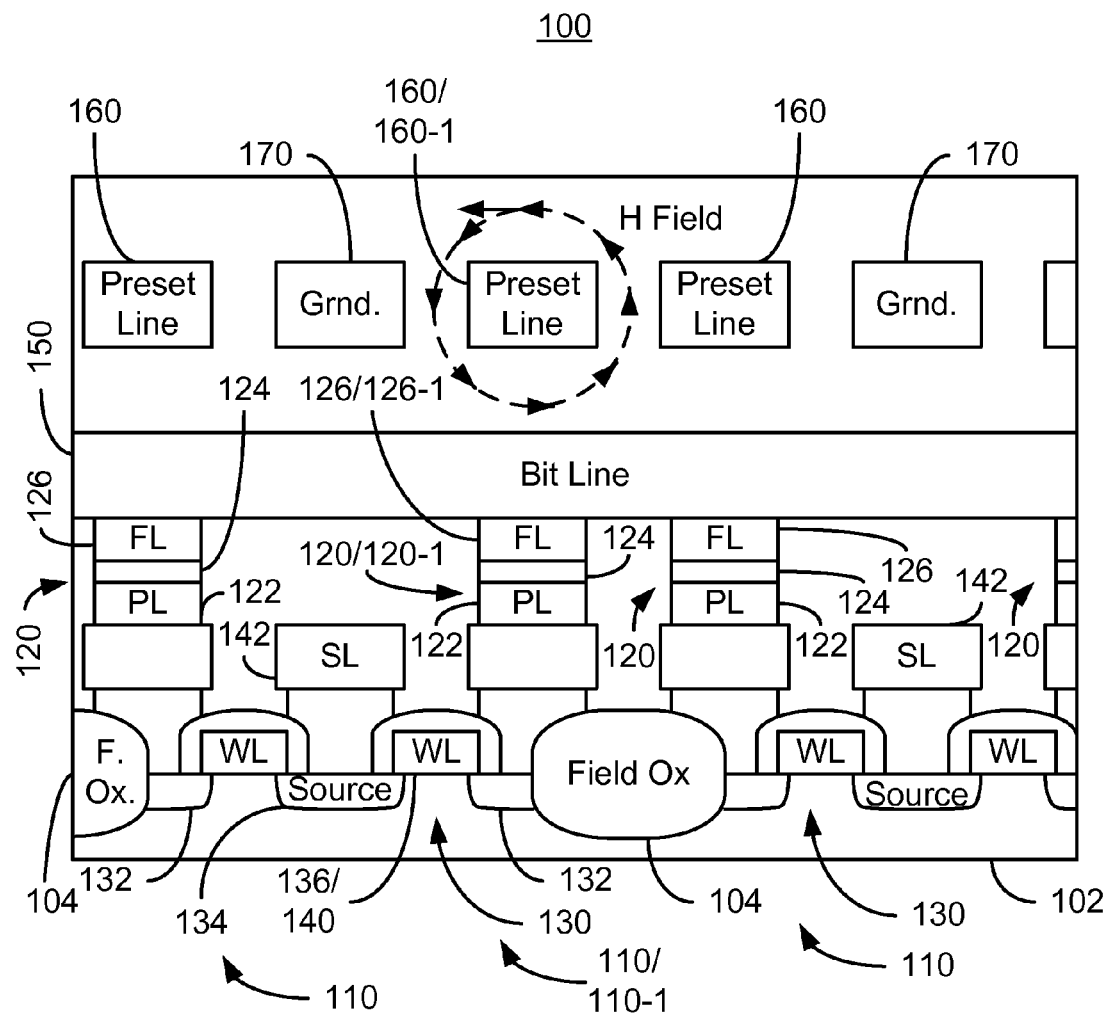
FIG. 3 is a diagram of depicting a cross-sectional view of a portion of an exemplary embodiment of a magnetic memory employing the spin transfer effect.

FIG. 3 is a diagram of depicting a cross-sectional view of a portion of an exemplary embodiment of a magnetic memory 100 employing the spin transfer effect. For clarity, FIG. 3 is not to scale. The memory 100 is described in the context of specific structures, numbers of components, and types of components, other structures, other components, other numbers of components or some combination thereof may be used. The memory 100 includes magnetic storage cells 110, word lines 140, bit line 150, preset lines 160, and grounds 170. In the particular cross-section depicted in FIG. 3 only one bit line is shown. However, a memory 100 generally includes a number of bit lines that may be oriented substantially in parallel.

The storage cells 110 are built on substrate 102. Pairs of storage cells 110 may be separated by field oxide 104. Each storage cell 110 includes a magnetic element 120 and a selection device 130. In the embodiments shown, a single magnetic element 120 and a single selection device 130 are in each storage cell 110. However, in other embodiments, multiple magnetic elements 120 and/or multiple selection devices 130 might be used in each storage cell 110. In the embodiment shown, the magnetic element 120 is a magnetic tunneling junction employing a spin-transfer based switching mechanism. However, another type of magnetic element that is also switched via spin transfer may also be used. The magnetic element 120 includes a pinned layer (PL) 122, a tunneling barrier layer 124, and a free layer (FL) 126. In other embodiments, the magnetic element 120 may include other and/or additional components. For example, an additional tunneling barrier layer (not shown) and an additional pinned layer (not shown) may be included. The free layer 126 has a magnetization (not shown in FIG. 3) which is switched, or programmed, via spin transfer torque. Based on the orientation of the free layer magnetization with respect to the magnetization of the pinned layer, the state of the magnetic element 120 may be determined. The selection device 130 is used to select particular storage cells 110 for writing and/or reading. In the embodiment shown, the selection device 130 is a transistor including source 134, drain 132, and gate 136 that is also part of the word line 140. In the embodiment shown, the selection device 130 is an n-channel device. However, in other embodiments, the selection device 130 may be a p-channel device. Further, other selection devices might be used in other embodiments.

In some embodiments, the free layer 126 and/or the magnetic element 120 in its entirety has an anisotropy such that the equilibrium position of the magnetization of the free layer 126 is parallel or antiparallel to a particular direction. The free layer 126 thus has an easy axis along the particular direction. For example, the easy axis of the free layer 126 might be perpendicular to the page (along the y direction). Thus, the magnetization of the free layer 126 may be out of the page or into the page when programmed in a high resistance or low resistance state. In other embodiments, the easy axis of the free layer 126 might be along the x-axis. Thus, the free layer magnetization may be parallel or antiparallel to the positive x-direction when programmed in a high resistance or low resistance state. In other embodiments, other orientations of the easy axis are possible.

Although the magnetization of the free layer 126 is described as being oriented along the easy axis, there is typically some distribution of magnetizations for the free layers 126. For example, at least a portion of the distribution may be due to the temperature of the magnetic memory 100. Because the temperature of the magnetic memory 100 is above absolute zero (0 K), there are thermal fluctuations in the magnetic moment of the free layer 126. These thermal fluctuations may cause a distribution in the magnetic moments of the free layers 126. In addition, the easy axes of the free layers 126 may vary in direction due to variations in processing of the magnetic elements 120. Thus, the magnetizations of the free layers 126 vary from storage cell 110 to storage cell 110. Consequently, although described as being along the easy axis, there is some distribution in the equilibrium orientation of the magnetization of the free layer 126.

The word lines 140 and bit lines 150 are coupled with the storage cells 110 and used in selecting and driving read and/or write currents through the storage cell 110. In the embodiment shown, the word line 140 is used to enable the selection device 130. Currents are driven between the bit line 150 and the source line (SL) 142. For example, a read current might be driven from the bit line 150, through the magnetic element 120, then through the enabled selection device 130 to the source line 142, which may be coupled to the ground 170. Write currents may be driven in the same direction as or in the opposite direction to the read current, depending upon the state to which the storage cell 110 (and thus the magnetic element 120) is desired to be programmed.

The preset line 160 carries a preset current that is used in writing to the selected storage cells. However, the preset current is not driven through the magnetic element 120. Stated differently, the preset line 160 may be electrically isolated from the magnetic element(s) 120 selected for writing. Further, the preset line 160 used is in proximity to the selected magnetic element 120. For example, the preset line 160-1 is used when the magnetic element 120-1 is desired to be programmed. In an ideal case, the preset line 160-1 might be desired to adjoin the magnetic element 120-1 yet be electrically isolated from the magnetic element 120-1. In some embodiments, the preset line 160-1 used to program selected memory cells is desired to be within five hundred nanometers of the free layer 126-1 of the selected memory cell 110-1. In other embodiments, the preset line 160-1 used to program selected memory cells is desired to be within three hundred nanometers of the free layer 126-1 of the selected memory cell 110-1. In other embodiments, the preset line 160-1 used to program selected memory cells is desired to be within two hundred nanometers of the free layer 126-1 of the selected memory cell 110-1. In the embodiment shown in FIG. 3, however the bit line 150 resides between the preset lines 160 and the storage cells 110.

In operation, one or more magnetic storage cells 110 are selected for writing. For simplicity, it is assumed that a single magnetic storage cell 110-1 is selected for programming. However, in another embodiment, multiple magnetic storage cells 110 may be selected. These magnetic storage cells 110 may be along a particular word line (WL) 140 or may be along a particular bit line 150. However, in another embodiment, other sets of magnetic storage cells 110 may be selected for programming.

A preset current is driven through one or more of the preset lines 160 corresponding to the magnetic storage cells 110 selected for writing. For simplicity, it is assumed that a single preset line 160-1 is used for programming a single magnetic storage cell 110-1. However, in other embodiments, multiple preset lines 160 may be used in programming one or more magnetic storage cells 110. The preset current generates a magnetic field. Again, for simplicity, a magnetic field from a single preset line 160-1 is assumed. However, the magnetic field generated by the preset current at a particular magnetic element 110 may be generated by multiple preset lines 160. The magnetic field generated at the selected magnetic element 120-1 of the selected storage cell 110-1 is insufficient in and of itself to switch the magnetization of the free layer 126. For example, the magnetic field may be on the order of tens of Oe, while the anisotropy energy corresponds to a field of a few hundred Oe. In some embodiments, the magnetic field may be not more than twenty Oe. In other embodiments, the magnetic field may be not more than fifteen Oe. In other embodiments, the magnetic field may be not more than ten Oe. In other embodiments, the magnetic field may be not more than five Oe. Thus, the preset current driven through the preset line 160-1 may be relatively small. For example, the write current generally used currently is on the order of one hundred microamps or less. The preset current should be less than twenty milliamps. In some embodiments, the preset current may not be more than ten milliamps. In some such embodiments, the preset current is not more than five milliamps. In other embodiments, the preset current may be not more than two milliamps. In still other embodiments, the preset current may be not more than one milliamp, or 0.5 milliamp. In some embodiments, the preset current may be even smaller. Table 1 depicts examples of preset currents, distances between the preset line 120-1 and the free layer 126-1 of the selected memory cell 110-1, and the estimated magnetic field generated at the free layer 126-1. The magnetic field at the free layer 126 is calculated as the current divided by two times pi times the distance to the free layer. However, note that the quantities in Table 1 are for exemplary purposes only. Thus, the magnitudes of the quantities and relationships between the components depicted in Table 1 are not intended to limit the exemplary embodiments described herein.

TABLE 1

| Preset Current (μa) | Distance to Free Layer (nm) | Magnetic Field at Free Layer (Oe) |
| --- | --- | --- |
| 500 | 300 | 3 |
| 500 | 200 | 5 |
| 1000 | 300 | 6 |
| 1000 | 200 | 10 |
| 2000 | 300 | 13 |
| 2000 | 200 | 20 |

Figure 1:
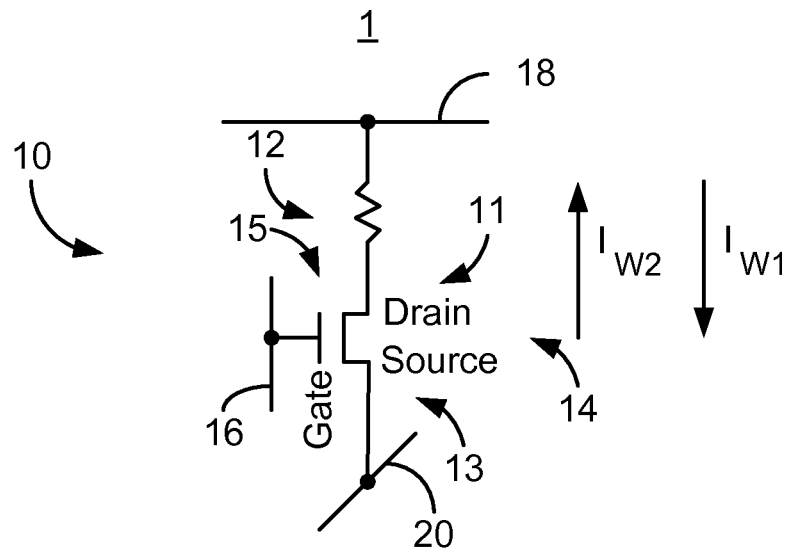
FIG. 1 is a diagram of a portion of a conventional magnetic memory employing the spin transfer effect.
Figure 2:
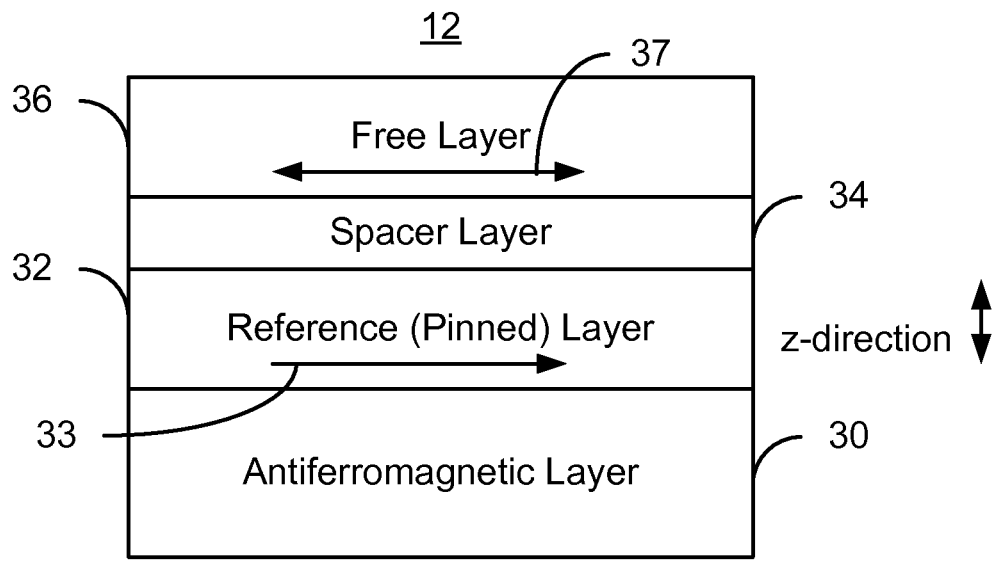
FIG. 2 is a diagram of a conventional magnetic element in a conventional magnetic memory.

In the embodiment shown in FIG. 1, the magnetic field at the free layer 126-1 is along the x-axis. In some embodiments, this magnetic field is along the hard axis of the free layer 126-1 (i.e. perpendicular to the easy axis). In such embodiments, the easy axis may be perpendicular to plane (e.g. along the z-axis) or along the y-axis. In other embodiments, the magnetic field may be along the easy axis. In such embodiments, the easy axis would be along the x-axis. In still other embodiments, the magnetic field may be applied in another direction.

The magnetic field generated by the preset current and applied at the free layer 126-1 orients the magnetic moment of the free layer 126-1 in the direction of the magnetic field. Stated differently, the general direction of the distribution of magnetic moments of the free layer 126-1 is moved to be closer to the direction of the magnetic field applied at the free layer 126-1. In some embodiments, the distribution of magnetic moments becomes smaller. More of the magnetic moments are oriented closer to the particular direction of the magnetic field. For example, a magnetic field along the hard axis of the free layer 126-1 may orient the magnetic moment of the free layer a few degrees from the easy axis. In some embodiments, the magnetic moment of the free layer 126-1 may be oriented at least five and not more than ten degrees from the easy axis. Although there may still be a distribution in the magnetic moment of the free layer 126-1, more will be oriented in this direction than in the absence of the magnetic field. Thus, the distribution of magnetic moments may be smaller.

While the magnetic moment of the free layer 126-1 is still aligned by the magnetic field generated by the preset current, a write current is driven through the bit line 150 and storage cell 110-1. Depending on the state to which the magnetic element 120-1 is desired to be programmed, the write current is driven from the bit line to the magnetic element 120-1 or vice versa. The write current becomes spin polarized in the magnetic element 120-1, and sufficient spin torque may be transferred to the free layer 126-1 to program the free layer 126-1 to the desired state. In some embodiments, the preset current is started at substantially the same time as the write current through the magnetic element 120-1. In such embodiments, the preset current, and thus the magnetic field, may be turned off either while the write current is still being driven through the magnetic element 120-1, at substantially the same time as the write current is turned off, or after the write current is turned off. Alternatively, the preset current may be turned on before the write current is driven through the magnetic element 120-1. In some such embodiments, the preset current may be turned off while the write current is still being driven through the magnetic element 120-1, at substantially the same time as the write current is turned off, or after the write current is turned off. Alternatively, the preset current may be pulsed so that it is turned on and off before the write current is driven through the magnetic element 120-1. However, the time between the preset current, and thus the magnetic field, being turned off and the time in which the write current is driven through the magnetic element 120-1 is sufficiently small that the magnetic moment of the free layer 126-1 does not relax back to its equilibrium state. Thus, the magnetic moment of the free layer 126-1 remains oriented by the magnetic field during programming.

As discussed above, the preset line 160 may be used to generate a small magnetic field to orient the magnetic moment of the free layer 126-1 to be programmed. Such an orientation may reduce the distribution in magnetic moments of the storage cell(s) 110 to be programmed. FIGS. 4-7 depict exemplary embodiments of timing diagrams for a magnetic memory employing spin transfer torque in connection with a preset current. For clarity, the timing diagrams of FIGS. 4-7 are described in the context of the magnetic memory 100. Different and/or additional signals, such as decoding and enable/disable signals may also be used in practice. Further, the shape and duration of the timing diagrams depicted in FIGS. 4-7 are for exemplary purposes only and not intended to limit the timing described herein except as explicitly described.

Figure 4:
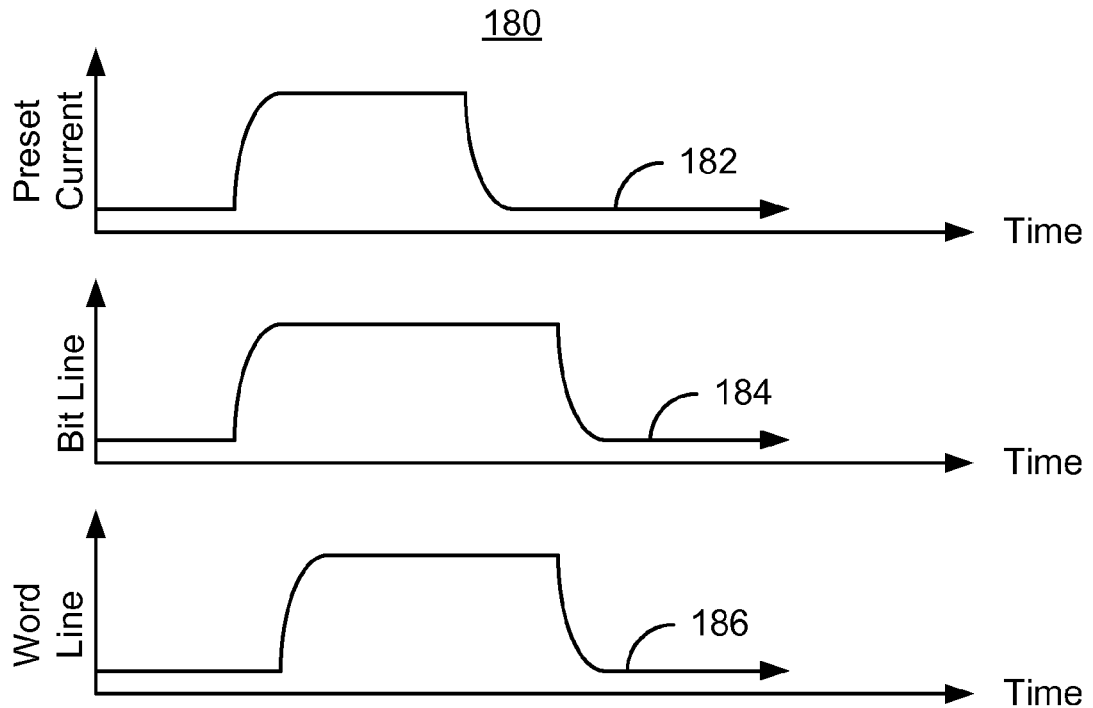
FIGS. 4-7 depict exemplary embodiments of timing diagrams for a magnetic memory employing the spin transfer effect and using preset lines.
Figure 5:
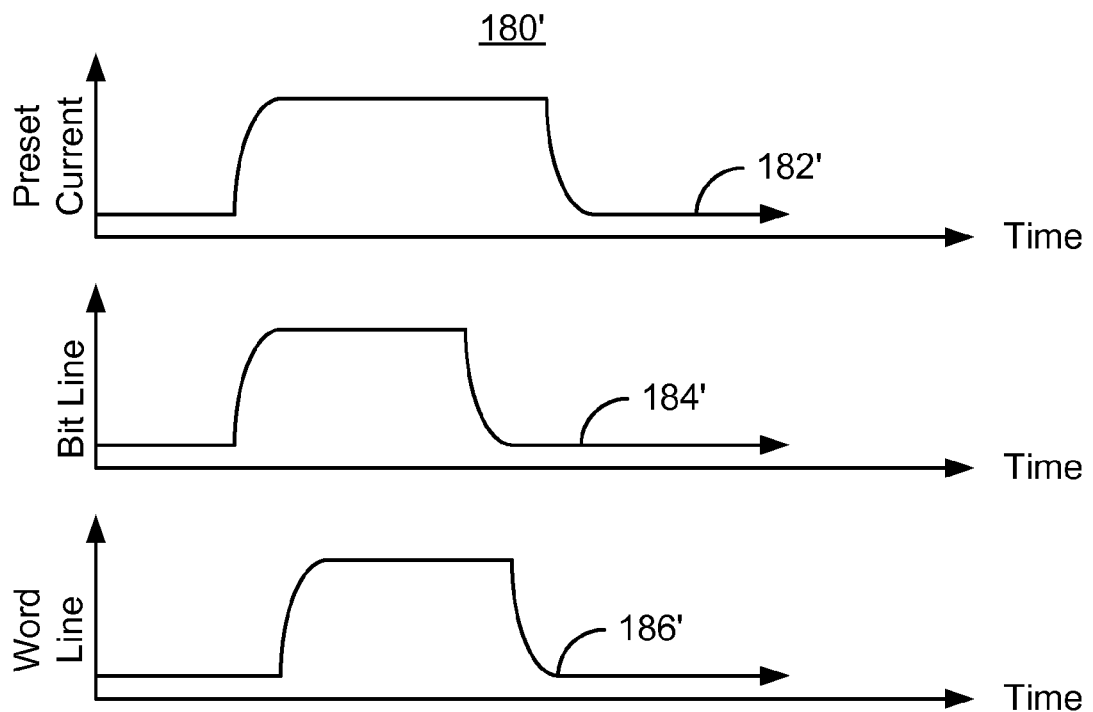

FIG. 4 depicts the timing 180 for a particular case. What is shown in FIG. 4 are the preset current 182 for the preset line 160-1, write current 184 to the corresponding bit line 150, and the signal 186 that enables the appropriate word line 140-1. Thus, both signals 184 and 186 are enabled for the write current to be driven through the magnetic element 120-1. As discussed above, the write current driven through the magnetic element 120-1 is to be started before the magnetic element 120-1 has an opportunity to relax back to an equilibrium state after the magnetic field from the preset current has oriented the magnetic moment of the free layer 126-1. In the timing diagram 180, the preset current 182 commences at substantially the same time as the write current through the magnetic element (both signals 184 and 186 enabled to allow the write current to flow through the magnetic element 120-1). In the embodiment shown, signals 184 and 186 do not start at the same time. However, in other embodiments, the timing between the signals 184 and 186 may be different. The preset current 182 is shown as terminating before the write current through the magnetic element 120-1 terminates (184 or 186 going to zero). However, in other embodiments, the preset current 182 may terminate at other times such as before the write current has reached is maximum, at the same time as the write current terminates, or after the write current terminates. For example, FIG. 5 depicts another timing diagram 180'. The timing diagram 180' and signals 182', 184', and 186' are analogous to the timing diagram 180 and signals 182, 184, and 186, respectively. Thus, the preset current 182' is for the preset line 160-1, the write current 184' is for the corresponding bit line 150, and the signal 186' enables the appropriate word line 140-1. The preset current 182' is shown as terminating after the write current through the magnetic element 120-1 terminates. Allowing the preset current 182' to terminate after the write current is possible. However, such a situation is generally undesirable as power is unnecessarily consumed by the preset current 182' after the write current has terminated. Because the preset current 182/182' starts at substantially the same time as the write current through the magnetic element 120-1, the preset current 182/182' may orient the magnetic moment of the free layer 126-1 for writing.

Figure 6:
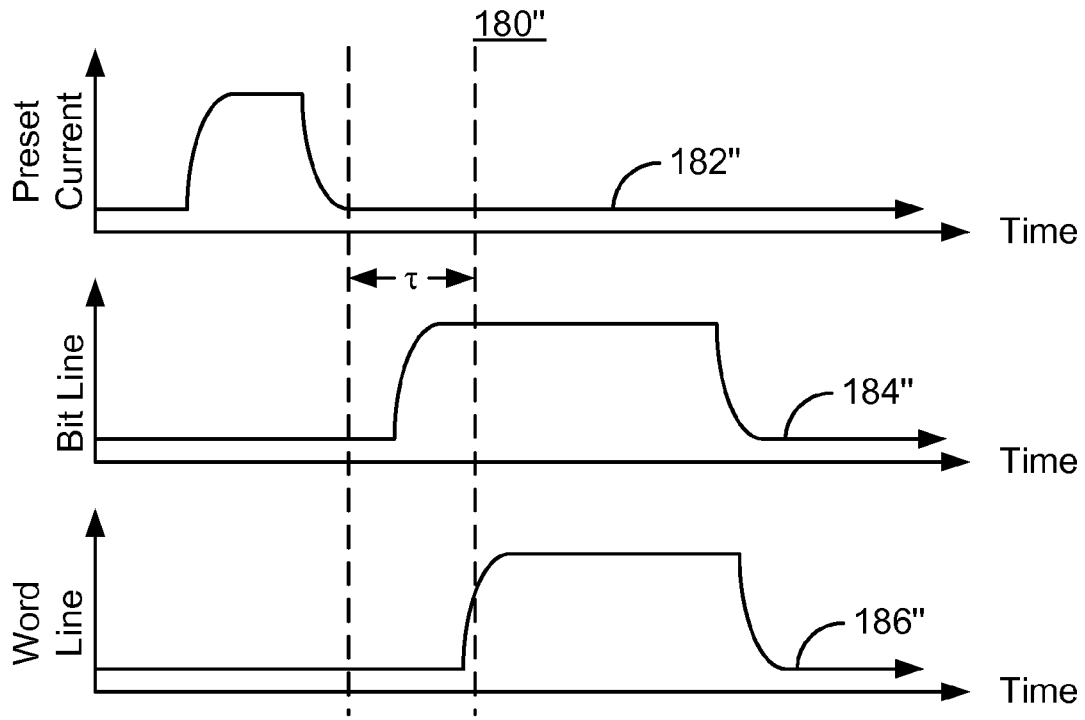
Figure 7:
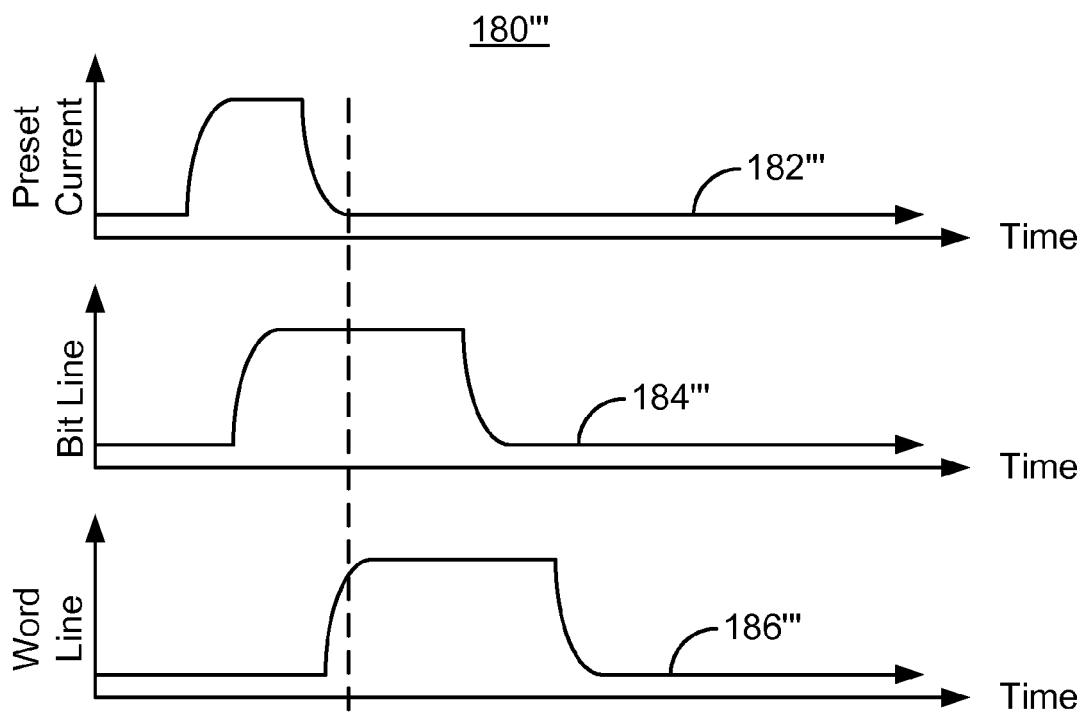

FIG. 6 depicts another timing diagram 180". For the timing diagram 180", the preset current 182" is driven through the preset line 160-1 and generates a magnetic field, the write current 184" is driven through the corresponding bit line 150, and the signal 186" enables the appropriate word line 140-1. Thus, both signals 184" and 186" are enabled for the write current to be driven through the magnetic element 120-1. As discussed above, the write current driven through the magnetic element 120-1 is to be started before the magnetic element 120-1 has an opportunity to relax back to an equilibrium state after the magnetic field from the preset current has oriented the magnetic moment of the free layer 126-1. In the timing diagram 180", the preset current 182" commences before the write current is driven through the magnetic element (both signals 184 and 186 enabled to allow the write current to flow through the magnetic element 120-1). The preset current 182" is shown as terminating before the write current is driven through the magnetic element. The time between the preset current 182" terminating and write current being driven through the magnetic element 120-1 is τ. This time is less than the relaxation time for the free layer magnetic moment to relax back to the equilibrium state. The preset current 182" is pulsed and terminated before the write current is driven through the magnetic element 120-1, but still orients the magnetic moment of the free layer 126-1 for writing. The preset current 182" may also terminate at other times. For example, FIG. 7 depicts another timing diagram 180'''. The timing diagram 180''' and signals 182''', 184''', and 186''' are analogous to the timing diagram 180" and signals 182", 184", and 186", respectively. Thus, the preset current 182''' is for the preset line 160-1, the write current 184''' is for the corresponding bit line 150, and the signal 186''' enables the appropriate word line 140-1. The preset current 182''' commences before the write current through the magnetic element 120-1 commences (signals 184''' and 186''' enabled). The preset current 182" ends after the write current has started to be driven through the magnetic element 120-1 but before the write current has reached its maximum value. In other embodiments, the preset current 182" may go to zero after the write current has reached is maximum, at substantially the same time as the write current terminates, or after the write current goes to zero. Thus, the preset current 182"/182''' may orient the magnetic moment of the free layer 126-1 for writing.

Through the use of the present lines 160 and preset currents 182/182'/182"/182''', a magnetic field that orients the magnetic moment of the free layer 126 for writing may be provided. Because the magnetic moment of the free layer 126 is oriented by the magnetic field, the thermal and other distribution of the magnetic moments of the free layers 126 may be reduced during writing. Consequently, the distribution in the probability of switching (switching probability distribution) may be reduced. Thus, write operation may be improved and the switching speed improved. Furthermore, as described above, the magnetic field provided by the preset current may be oriented away from the easy axis of the magnetic element 120. For example, the magnetic field generated by the preset current may be at an angle of five to ten degrees from the easy axis of the free layer 126. In other embodiments, the magnetic field generated may be along the hard axis of the free layer 126. In embodiments in which the magnetic moment of the free layer 126 is oriented away from the easy axis, further improvements may be achieved. In such embodiments, the magnetic field generated by the preset current may reduce the switching current. Thus, a smaller write current may be used. The benefits above might be achieved without substantially increasing the power consumed by the device. Because the magnetic field does not switch the magnetization of the free layer 126 and because the preset line 160 is in proximity to the magnetic element 110-1 being switched, a smaller magnetic field may be used. Because it generates a smaller magnetic field, a smaller preset current may be used. For example, the preset current may be as low as two hundred through five hundred micro amps. Thus, the additional power consumed due to the preset current may be small. Further, as discussed above, the preset current may be turned on and off again before the write current is driven through the magnetic element 110. Thus, the power consumed by the memory 100 may be further reduced. Consequently, performance of the memory 100 may be improved.

Figure 8:
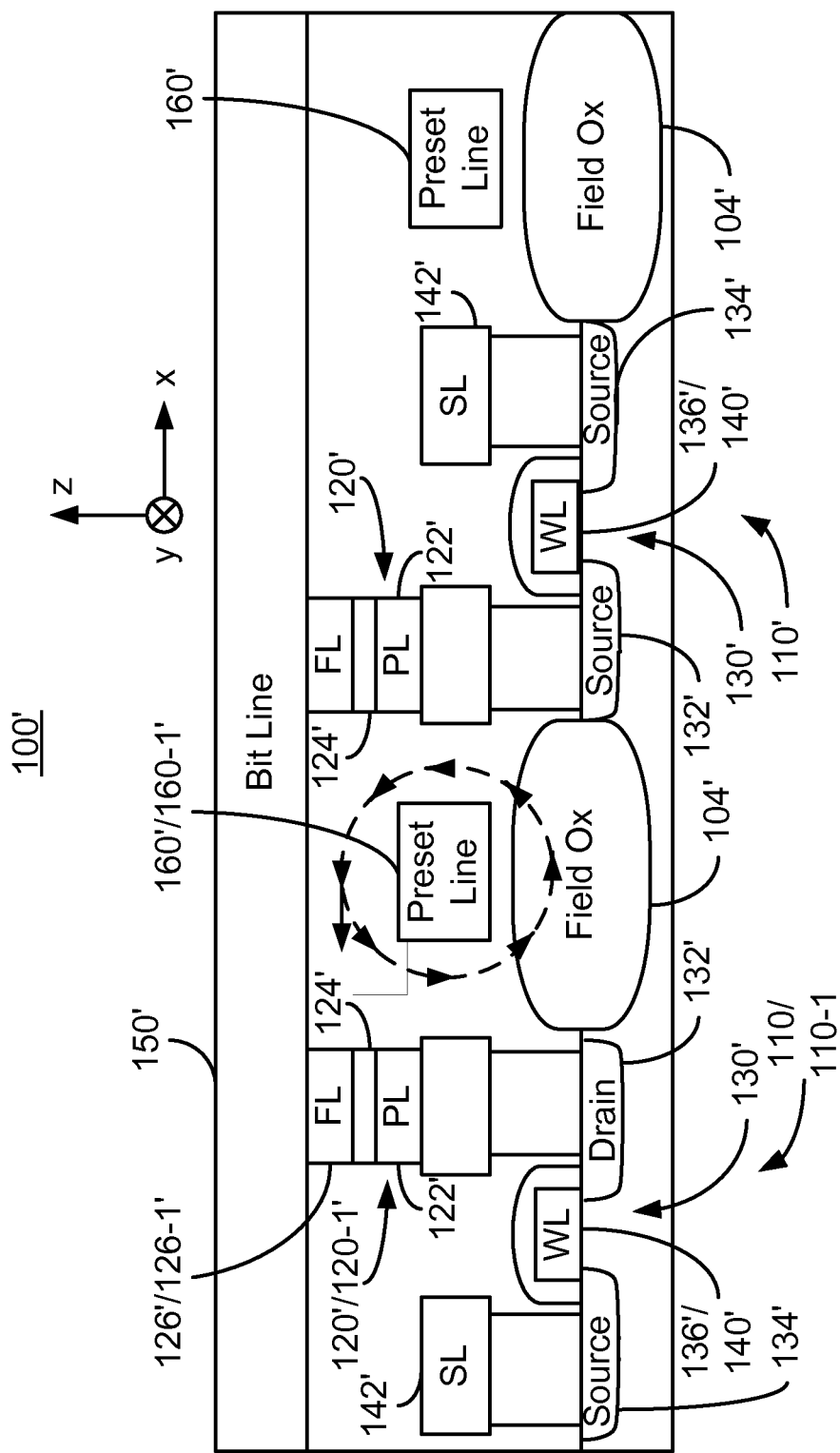
FIG. 8 is a diagram of depicting a cross-sectional view of a portion of another exemplary embodiment of a magnetic memory employing the spin transfer effect.

FIG. 8 is a diagram of depicting a cross-sectional view of a portion of another exemplary embodiment of a magnetic memory 100' employing the spin transfer effect. For clarity, FIG. 8 is not to scale. The magnetic memory 100' is analogous to the magnetic memory 100. Thus, the magnetic memory 100' includes a substrate 102', field oxide 104', storage cells 110', selected storage cell 110-1', magnetic elements 120', selected magnetic element 120-1', pinned layer 122', tunneling oxide 124', free layer 126', selected free layer 126-1', selection device 130', drain 132', source 134', gate 136', word line 140', bit line 150', preset lines 160', selected preset line 160-1', and grounds 170' that correspond to the substrate 102, field oxide 104, storage cells 110, selected storage cell 110-1, magnetic elements 120, selected magnetic element 120-1, pinned layer 122, tunneling oxide 124, free layer 126, selected free layer 126-1, selection device 130, drain 132, source 134, gate 136, word line 140, bit line 150, preset lines 160, selected preset line 160-1, and grounds 170.

In the embodiment depicted in FIG. 8, the preset line 160' is on the same side of the bit line 150' as the storage cells 110'. In addition, the preset line 160' may be between the storage cells 110'/magnetic elements 120'. Thus, the magnetic field generated by a preset current driven through the preset line 160' is substantially along the z-axis at the free layer 126'/126-1'. The magnetic field is thus substantially perpendicular to plane. If the magnetic field is along the hard axis, then the easy axis for the magnetic element 120'/120-1' would be in plane. For simplicity, a magnetic field from a single preset line 160-1' is assumed. However, the magnetic field at a particular magnetic element 110' may be generated by multiple preset lines 160'. The magnetic field generated by the preset current at the selected magnetic element 120-1' of the selected storage cell 110-1' is insufficient in and of itself to switch the magnetization of the free layer 126'. For example, the magnetic field may be on the order of tens of Oe, while the anisotropy energy corresponds to a field of a few hundred Oe. In some embodiments, the magnetic field may be not more than twenty Oe. In other embodiments, the magnetic field may be not more than fifteen Oe. In other embodiments, the magnetic field may be not more than ten Oe. In other embodiments, the magnetic field may be not more than five Oe. Further, the preset line 160-1' is desired to be close to the magnetic element 110-1' being programmed. In some embodiments, the distance between the preset line 160-1' and the magnetic element 110-1' are analogous to those described above for the memory 100. Thus, the preset current driven through the preset line 160-1' may be relatively small. For example, the preset current is desired to be less twenty milliamps. In some embodiments, the preset current may be not more than ten milliamps. In some such embodiments, the preset current is not more than five milliamps. In other embodiments, the preset current may be not more than two milliamps. In still other embodiments, the preset current may be not more than one milliamp, or 0.5 milliamp. For example, currents similar to those in Table 1 may be used. In other embodiments, the preset current may be even smaller. Such preset currents may generate magnetic fields at the free layer 126' having magnitudes similar to those depicted in Table 1.

The preset lines 160' may be used for carrying preset currents, which generate a magnetic field in the region of the free layer 126'. Thus, the magnetic moments of the free layers 126' may be better aligned, providing a smaller distribution in the magnetic moments. In some embodiments, this alignment may be off of the easy axis. As a result, the write current may also be reduced. Consequently, the memory 100' may share one or more of the benefits of the magnetic memory 100.

Figure 9:
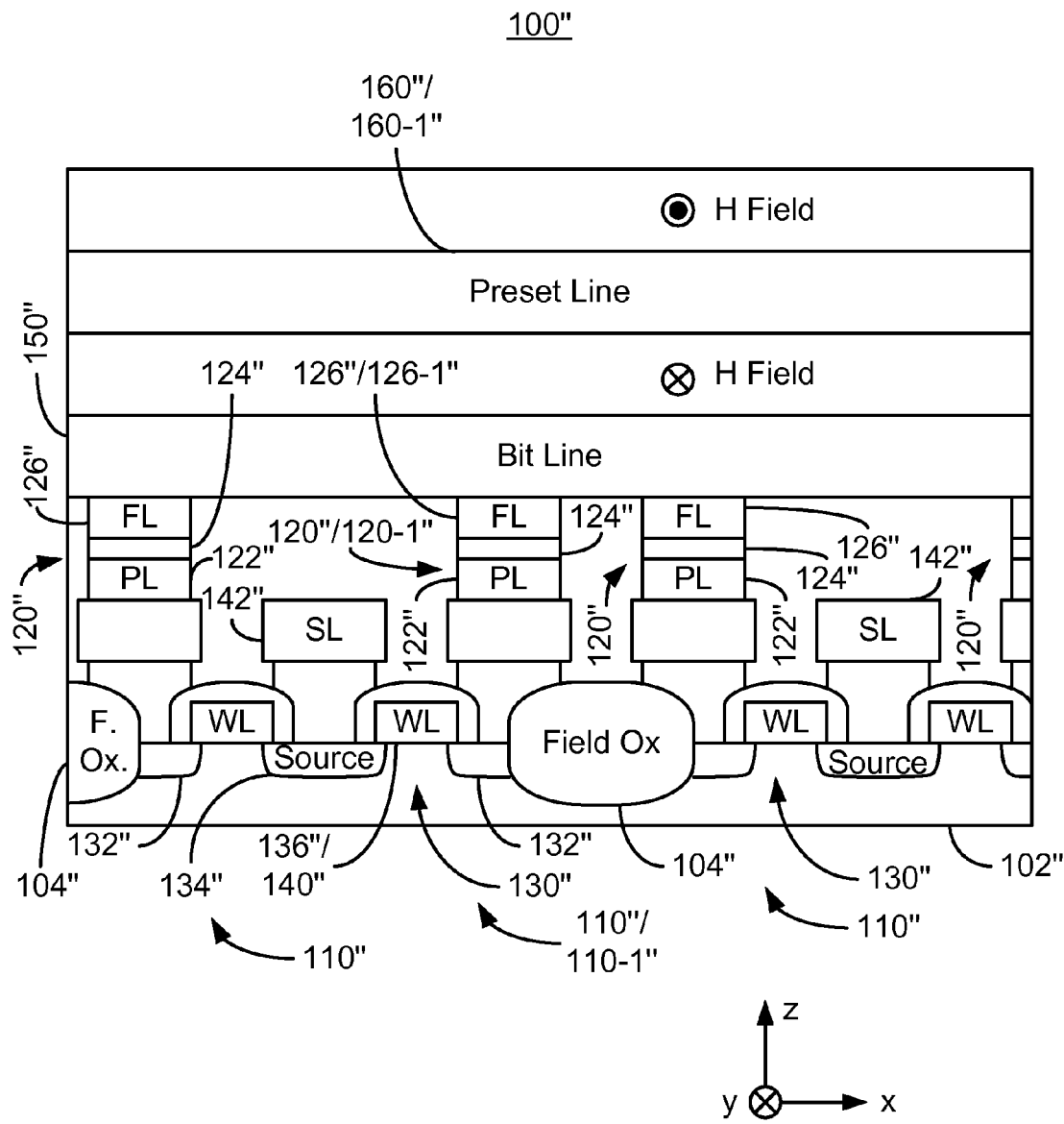
FIG. 9 is a diagram of depicting a cross-sectional view of a portion of another exemplary embodiment of a magnetic memory employing the spin transfer effect.

FIG. 9 is a diagram of depicting a cross-sectional view of a portion of another exemplary embodiment of a magnetic memory 100" employing the spin transfer effect. For clarity, FIG. 9 is not to scale. The magnetic memory 100" is analogous to the magnetic memory 100/100'. Thus, the magnetic memory 100" includes a substrate 102", field oxide 104", storage cells 110", selected storage cell 110-1", magnetic elements 120", selected magnetic element 120-1", pinned layer 122", tunneling oxide 124", free layer 126", selected free layer 126-1", selection device 130", drain 132", source 134", gate 136", word line 140", bit line 150", preset lines 160", selected preset line 160-1", and grounds 170" that correspond to the substrate 102/102', field oxide 104/104', storage cells 110/110', selected storage cell 110-1/110-1', magnetic elements 120/120', selected magnetic element 120-1/120-1', pinned layer 122/122', tunneling oxide 124/124', free layer 126/126', selected free layer 126-1/126-1', selection device 130/130', drain 132/132', source 134/134', gate 136/136', word line 140/140', bit line 150/150', preset lines 160/160', selected preset line 160-1/160-1', and grounds 170/170'.

In the embodiment depicted in FIG. 9, the preset line 160" is on the opposite side of the bit line 150" as the storage cells 110". In addition, the preset line 160" is substantially parallel to the bit line 150". Thus, the magnetic field generated by a preset current driven through the preset line 160" is substantially along the y-axis at the free layer 126"/126-1". If the magnetic field is along the hard axis, then the easy axis for the magnetic element 120"/120-1" would be along the x axis or perpendicular to the plane. For simplicity, a magnetic field from a single preset line 160-1" is assumed. However, the magnetic field at a particular magnetic element 110" may be generated by multiple preset lines 160". The magnetic field generated by the preset current at the selected magnetic element 120-1" of the selected storage cell 110-1" is insufficient in and of itself to switch the magnetization of the free layer 126". For example, the magnetic field may be on the order of tens of Oe, while the anisotropy energy corresponds to a field of a few hundred Oe. In some embodiments, the magnetic field may be not more than twenty Oe. In other embodiments, the magnetic field may be not more than fifteen Oe. In other embodiments, the magnetic field may be not more than ten Oe. In other embodiments, the magnetic field may be not more than five Oe. Further, the preset line 160-1" is desired to be close to the magnetic element 110-1" being programmed. In some embodiments, the distance between the preset line 160-1" and the magnetic element 110-1" are analogous to those described above for the memory 100. Thus, the preset current driven through the preset line 160-1''' may be relatively small. For example, the preset current is desired to be less than twenty milliamps. In some embodiments, the preset current may be not more than ten milliamps. In some such embodiments, the preset current is not more than five milliamps. In other embodiments, the preset current may be not more than two milliamps. In still other embodiments, the preset current may be not more than one milliamp, or 0.5 milliamp. For example, currents similar to those in Table 1 may be used. In some embodiments, the preset current may be even smaller. Such preset currents may generate magnetic fields at the free layer 126" having magnitudes similar to those depicted in Table 1.

The preset lines 160" may be used for carrying preset currents, which generate a magnetic field in the region of the free layer 126". Thus, the magnetic moments of the free layers 126" may be better aligned. As a result, the distribution of magnetic moments may be reduced. This alignment may also be off of the easy axis. The write current may, therefore, also be reduced. Consequently, the memory 100" may share one or more of the benefits of the magnetic memory 100.

Figure 10:
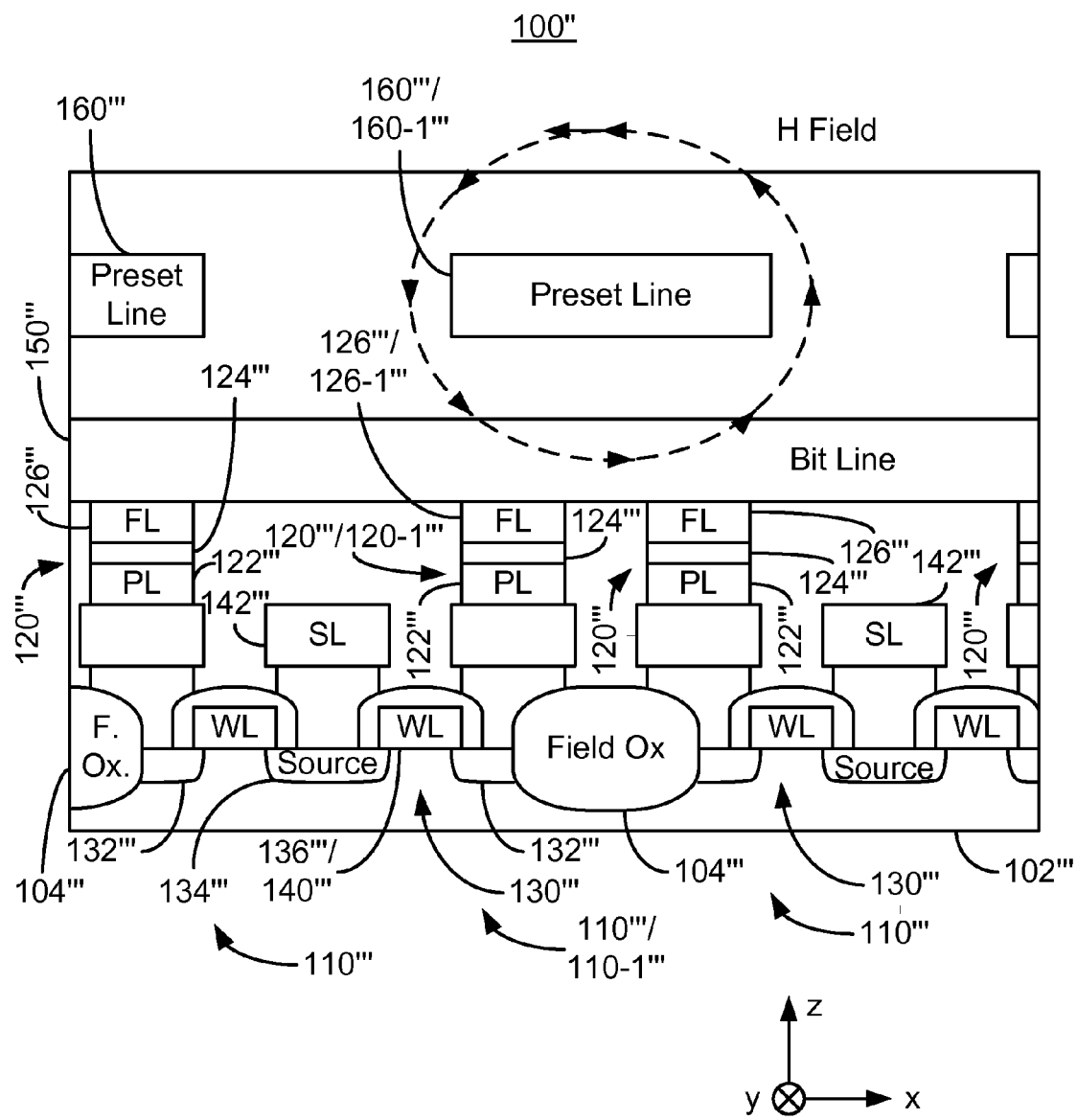
FIG. 10 is a diagram of depicting a cross-sectional view of a portion of another exemplary embodiment of a magnetic memory employing the spin transfer effect.

FIG. 10 is a diagram of depicting a cross-sectional view of a portion of another exemplary embodiment of a magnetic memory 100''' employing the spin transfer effect. For clarity, FIG. 10 is not to scale. The magnetic memory 100''' is analogous to the magnetic memory 100/100'/100". Thus, the magnetic memory 100''' includes a substrate 102''', field oxide 104''', storage cells 110''', selected storage cell 110-1''', magnetic elements 120''', selected magnetic element 120-1''', pinned layer 122''', tunneling oxide 124''', free layer 126''', selected free layer 126-1''', selection device 130''', drain 132''', source 134''', gate 136''', word line 140''', bit line 150''', preset lines 160''', selected preset line 160-1''', and grounds 170''' that correspond to the substrate 102/102'/102", field oxide 104/104'/104", storage cells 110/110'/110", selected storage cell 110-1/110-1'/110-1"//110-1', magnetic elements 120/120'/120", selected magnetic element 120-1/120-1'/120-1", pinned layer 122/122'/122", tunneling oxide 124/124'/124", free layer 126/126'/126", selected free layer 126-1/126-1'/126-1", selection device 130/130'/130", drain 132/132'/132", source 134/134'/134", gate 136/136'/136", word line 140/140'/140", bit line 150/150'/150", preset lines 160/160'/160", selected preset line 160-1/160-1'/160-1", and grounds 170/170'/170".

In the embodiment depicted in FIG. 10, the preset line 160''' is on the opposite side of the bit line 150''' as the storage cells 110'''. The preset line 160''' is substantially perpendicular to the bit line 150" and corresponds to multiple magnetic elements 120''' and thus multiple storage cells 110'''. In the embodiment shown, each preset line 160''' corresponds to and provides a magnetic field for two magnetic elements 120-1''' and 120-2. Thus, the magnetic field generated by a preset current driven through the preset line 160''' is substantially along the x-axis at the free layer 126'''/126-1'''/126-2. If the magnetic field is along the hard axis, then the easy axis for the magnetic element 120'''/120-1'''/120-2 would be along the y-axis or perpendicular to the plane. For simplicity, a magnetic field from a single preset line 160-1''' is assumed. However, the magnetic field at a particular magnetic element 110''' may be generated by multiple preset lines 160'''. The magnetic field generated by the preset current at the selected magnetic element 120-1''' of the selected storage cell 110-1''' is insufficient in and of itself to switch the magnetization of the free layer 126'''. For example, the magnetic field may be on the order of tens of Oe, while the anisotropy energy corresponds to a field of a few hundred Oe. In some embodiments, the magnetic field may be not more than twenty Oe. In other embodiments, the magnetic field may be not more than fifteen Oe. In other embodiments, the magnetic field may be not more than ten Oe. In other embodiments, the magnetic field may be not more than five Oe. Further, the preset line 160-1''' is desired to be close to the magnetic element 110-1''' being programmed. In some embodiments, the distance between the preset line 160-1''' and the magnetic element 110-1''' are analogous to those described above for the memory 100. Thus, the preset current driven through the preset line 160-1''' may be relatively small. For example, the preset current is desired to be less than twenty milliamps. In some embodiments, the preset current may be not more than ten milliamps. In some such embodiments, the preset current is not more than five milliamps. In other embodiments, the preset current may be not more than two milliamps. In still other embodiments, the preset current may be not more than one milliamp, or 0.5 milliamp. For example, currents similar to those in Table 1 may be used. In some embodiments, the preset current may be even smaller. Such preset currents may generate magnetic fields at the free layer 126''' having magnitudes similar to those depicted in Table 1.

Because the preset lines 160''' may be used for carrying preset currents, a magnetic field may be generated in the region of the free layer 126'''. Thus, the magnetic moments of the free layers 126''' may be better aligned. As a result, the distribution of magnetic moments may be reduced. This alignment may also be off of the easy axis. The write current may, therefore, also be reduced. Consequently, the memory 100''' may share one or more of the benefits of the magnetic memory 100.

Figure 11:
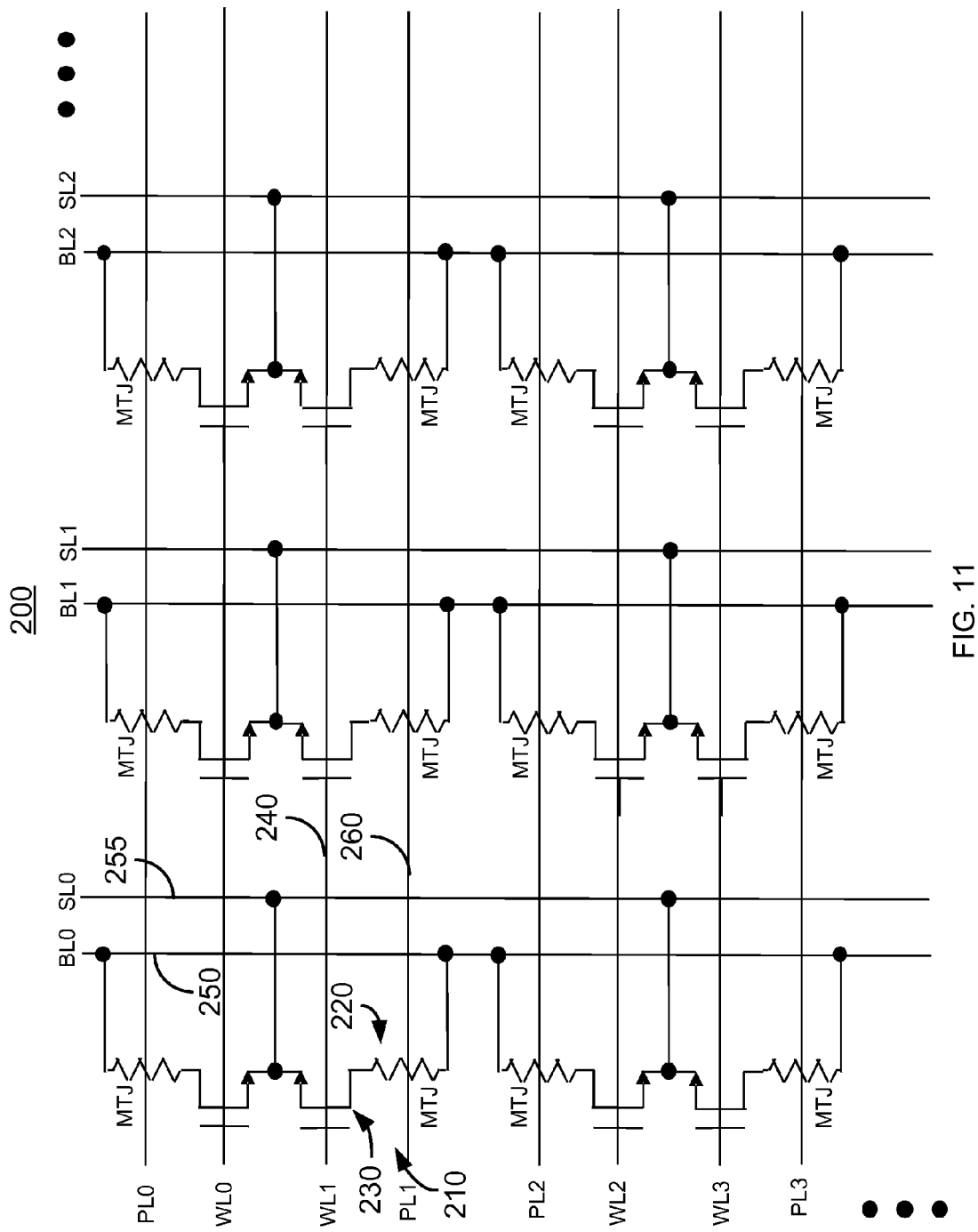
FIG. 11 is a diagram of depicting a portion of an exemplary embodiment of a magnetic memory employing the spin transfer effect.

FIG. 11 is a diagram of depicting a portion of an exemplary embodiment of a magnetic memory 200 employing the spin transfer effect. More specifically, FIG. 11 depicts a circuit diagram of one embodiment of a magnetic memory 200 employing preset lines. The magnetic memory 200 may be analogous to the magnetic memory 100, 100', 100", and/or 100". The memory 200 is described in the context of specific structures, numbers of components, and types of components, other structures, other components, other numbers of components or some combination thereof may be used. The memory 200 includes magnetic storage cells 210, word lines 240, bit lines 250, preset lines 260, and grounds (not shown). Each storage cell 210 includes a magnetic element 220 and a selection device 230. The storage cells 210, magnetic elements 220, selection devices 230, word lines 240, bit lines 250, and preset lines 260 may correspond to the storage cells 110/110'/110"/110", magnetic elements 120/120'/120"/120", selection devices 130/130'/130"/130''', word lines 140/140'/140"/140''', bit lines 150/150'/150"/150''', and preset lines 160/160'/160"/160'''. However, in other embodiments, the storage cells 210, magnetic elements 220 employing spin transfer, selection devices 230, word lines 240, bit lines 250, and preset lines 260 may correspond to other storage cells, magnetic elements, selection devices, word lines, bit lines, and preset lines. In the embodiment shown, each word line 240 has a corresponding preset line 260. However, in another embodiment, a preset line 260 may correspond to multiple word lines 250. Further, source lines 255 are shown. The source lines 255 may be connected to ground (not shown) or a voltage depending on the write currents and/or read currents desired to be driven through the storage cells 210.

The magnetic memory 200 functions in an analogous manner to the magnetic memories 100/100'/100"/100'''. The free layers of the magnetic elements 220 may be aligned using a magnetic field generated by the preset current through the preset line 260. One or more of the benefits of the magnetic memories 100/100'/100"/100'" may be achieved. Thus, performance of the magnetic memory 200 may be improved.

Figure 12:
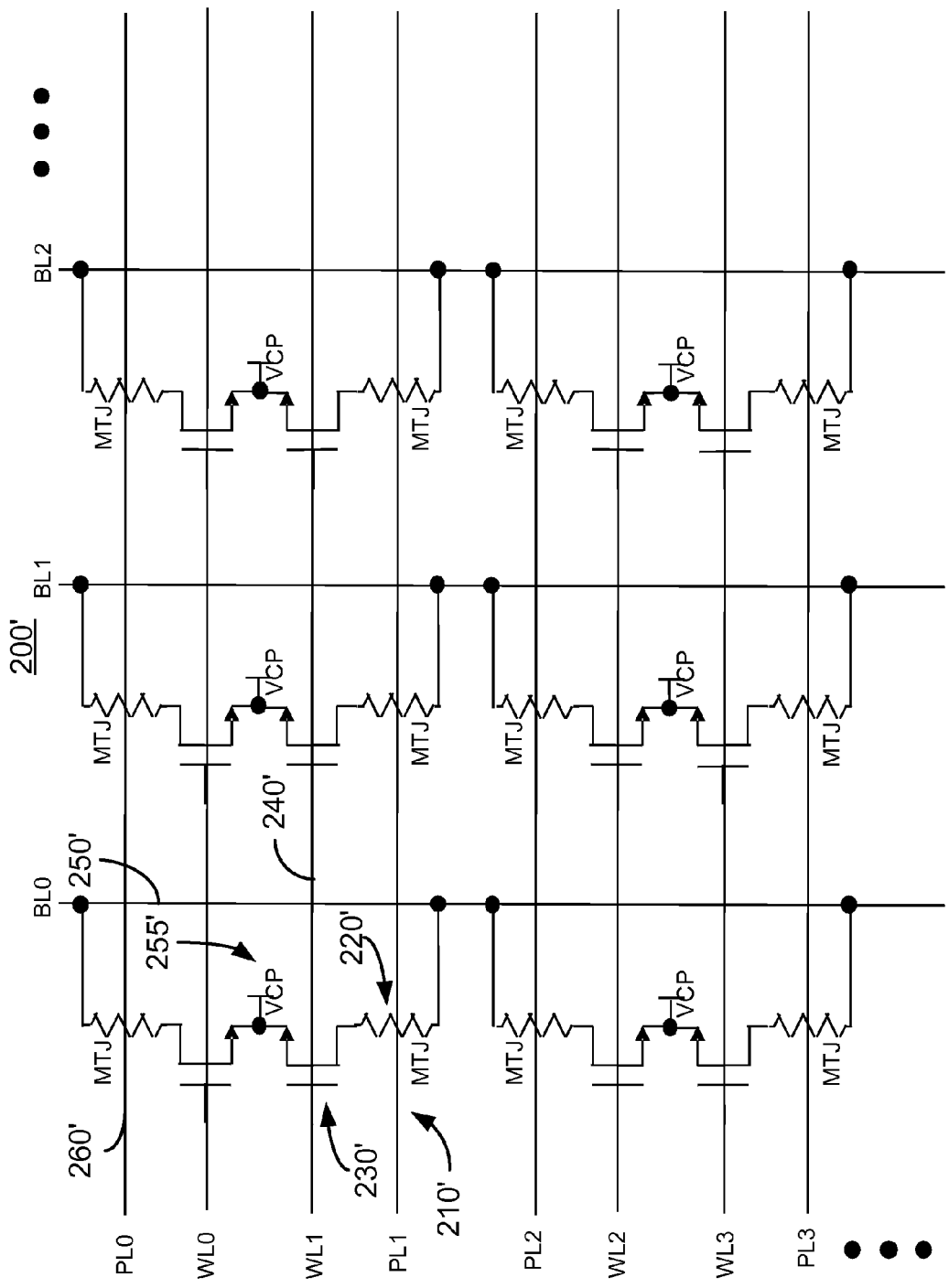
FIG. 12 is a diagram of depicting a portion of an exemplary embodiment of another magnetic memory employing the spin transfer effect.

FIG. 12 is a diagram of depicting a portion of an exemplary embodiment of another magnetic memory 200' employing the spin transfer effect. More specifically, FIG. 12 depicts a circuit diagram of one embodiment of a magnetic memory 200' employing preset lines. The magnetic memory 200' may be analogous to the magnetic memory 200, 100, 100', 100", and/or 100'". The memory 200' is described in the context of specific structures, numbers of components, and types of components, other structures, other components, other numbers of components or some combination thereof may be used. The memory 200' includes magnetic storage cells 210', magnetic elements 220', selection devices 230', word lines 240', bit lines 250', preset lines 260', and grounds (not shown) that may correspond to the storage cells 110/110'/110"/110'"/210, magnetic elements 120/120'/120"/120'"/220, selection devices 130/130'/130"/130'"/230, word lines 140/140'/140"/140'"/240, bit lines 150/150'/150"/150'"/250, and preset lines 160/160'/160"/160'"/260. However, in other embodiments, the storage cells 210', magnetic elements 220' employing spin transfer, selection devices 230', word lines 240', bit lines 250', and preset lines 260' may correspond to other storage cells, magnetic elements, selection devices, word lines, bit lines, and preset lines. In the embodiment shown, each word line 240' has a corresponding preset line 260'. However, in another embodiment, a preset line 260' may correspond to multiple word lines 250'. Also shown are common voltage planes 255' that may be used in lieu of or in addition to source lines. The common voltage plane 255' may be a plane fabricated in a layer above the bit lines. The common voltage plane 255' may be coupled to ground or a voltage depending upon the write currents and/or read currents desired to be driven through the magnetic elements 220'.

The magnetic memory 200' functions in an analogous manner to the magnetic memories 100/100'/100"/100'"/200. The magnetic moments of the free layers of the magnetic elements 220' may be better aligned. One or more of the benefits of the magnetic memories 100/100'/100"/100'"/200 may be achieved. Thus, performance of the magnetic memory 200' may be improved. Further, the use of the common plane 255' may reduce the number of lines, allowing the inclusion of a preset line 260' to result in a zero net change in the number of lines from a magnetic memory (not shown) which does not use a preset line. Consequently, layout and fabrication of the magnetic memory 200' at higher densities may be improved.

Figure 13:
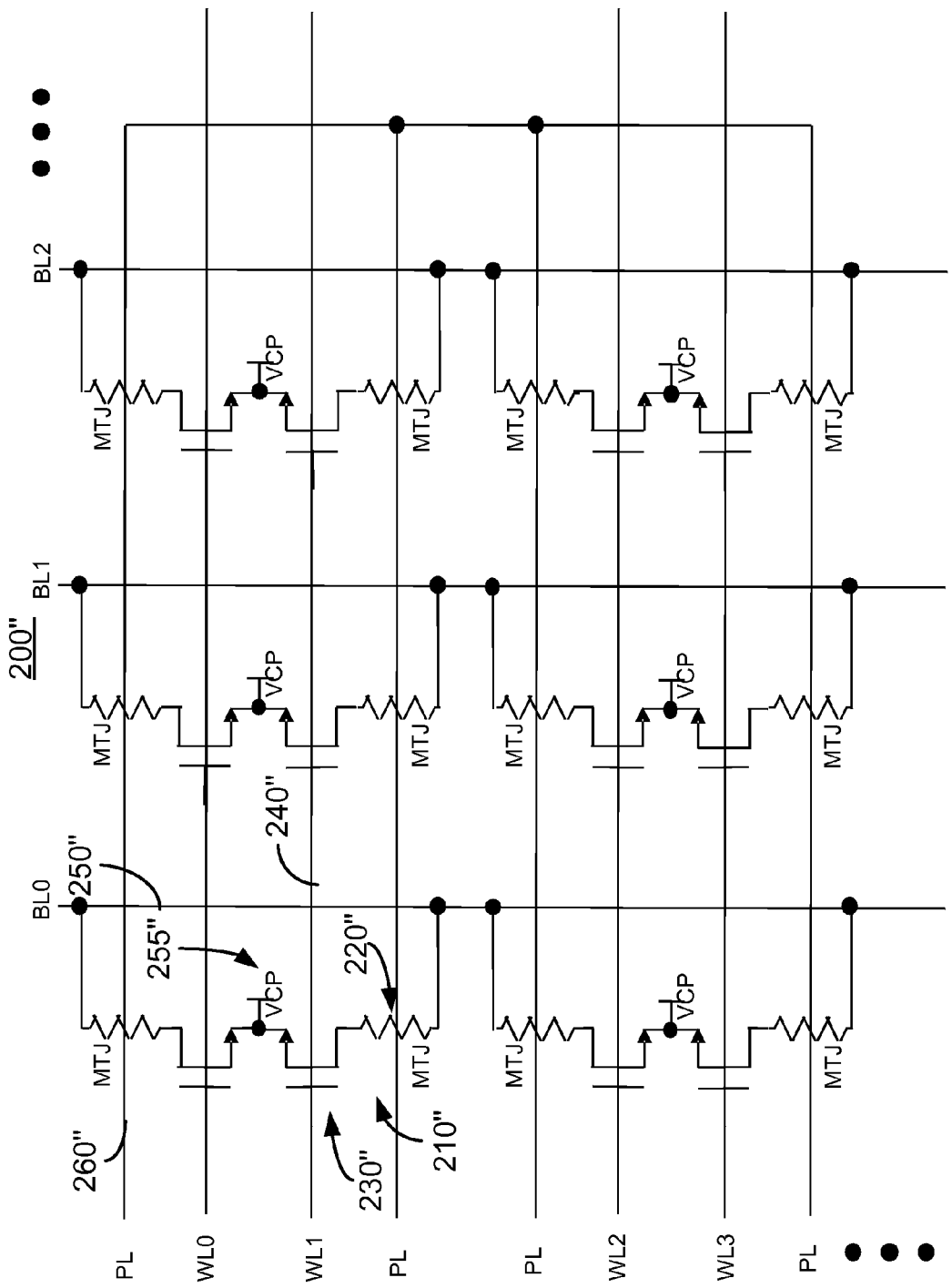
FIG. 13 is a diagram of depicting a portion of an exemplary embodiment of another magnetic memory employing the spin transfer effect.

FIG. 13 is a diagram of depicting a portion of an exemplary embodiment of another magnetic memory 200" employing the spin transfer effect. More specifically, FIG. 13 depicts a circuit diagram of one embodiment of a magnetic memory 200" employing preset lines. The magnetic memory 200' may be analogous to the magnetic memory 200, 200', 100, 100', 100", and/or 100'". The memory 200" is described in the context of specific structures, numbers of components, and types of components, other structures, other components, other numbers of components or some combination thereof may be used. The memory 200" includes magnetic storage cells 210", magnetic elements 220", selection devices 230", word lines 240", bit lines 250", preset lines 260", and grounds (not shown) that may correspond to the storage cells 110/110'/110"/110'"/210/210', magnetic elements 120/120'/120"/120'"/220/220', selection devices 130/130'/130"/130'"/230/230', word lines 140/140'/140"/140'"/240/240', bit lines 150/150'/150"/150'"/250/250', and preset lines 160/160'/160"/160'"/260/260'. However, in other embodiments, the storage cells 210", magnetic elements 220" employing spin transfer, selection devices 230", word lines 240", bit lines 250", and preset lines 260" may correspond to other storage cells, magnetic elements, selection devices, word lines, bit lines, and preset lines. In the embodiment shown, each word line 240" is shown adjacent to a corresponding preset line 260". However, the preset lines 260" are connected. This may be similar to the memory 100'" in which a single preset line 160'" corresponds to multiple magnetic storage cells 110'". For example, the memory 200" may be used in the case in which the layout does not accommodate all metal lines having the critical dimension and/or critical pitch. In some such embodiments, the preset lines 260" may be in the second or third level metal lines which have a wider pitch. This is shown by connecting multiple preset lines 260". However, in another embodiment, the preset lines 260" may be connected for another reason. Also shown are common voltage planes 255" that are analogous to the common voltage planes 255'.

The magnetic memory 200" functions in an analogous manner to the magnetic memories 100/100'/100"/100'"/200/200'. Because the magnetic field generated by the preset current may align the magnetic moments of the free layers of the magnetic elements 220", one or more of the benefits of the magnetic memories 100/100'/100"/100'"/200/200' may be achieved. Thus, performance of the magnetic memory 200" may be improved. The use of the common plane 255" may reduce the number of lines, allowing the inclusion of a preset line 260" to result in a zero net change in the number of lines from a magnetic memory (not shown) which does not use a preset line. Alternatively, the number of lines having a critical dimension and/or critical pitch may be reduced by using preset lines 260" that are connected or have a wider dimension and/or pitch. Consequently, layout and fabrication of the magnetic memory 200" at higher densities may be improved.

Figure 14:
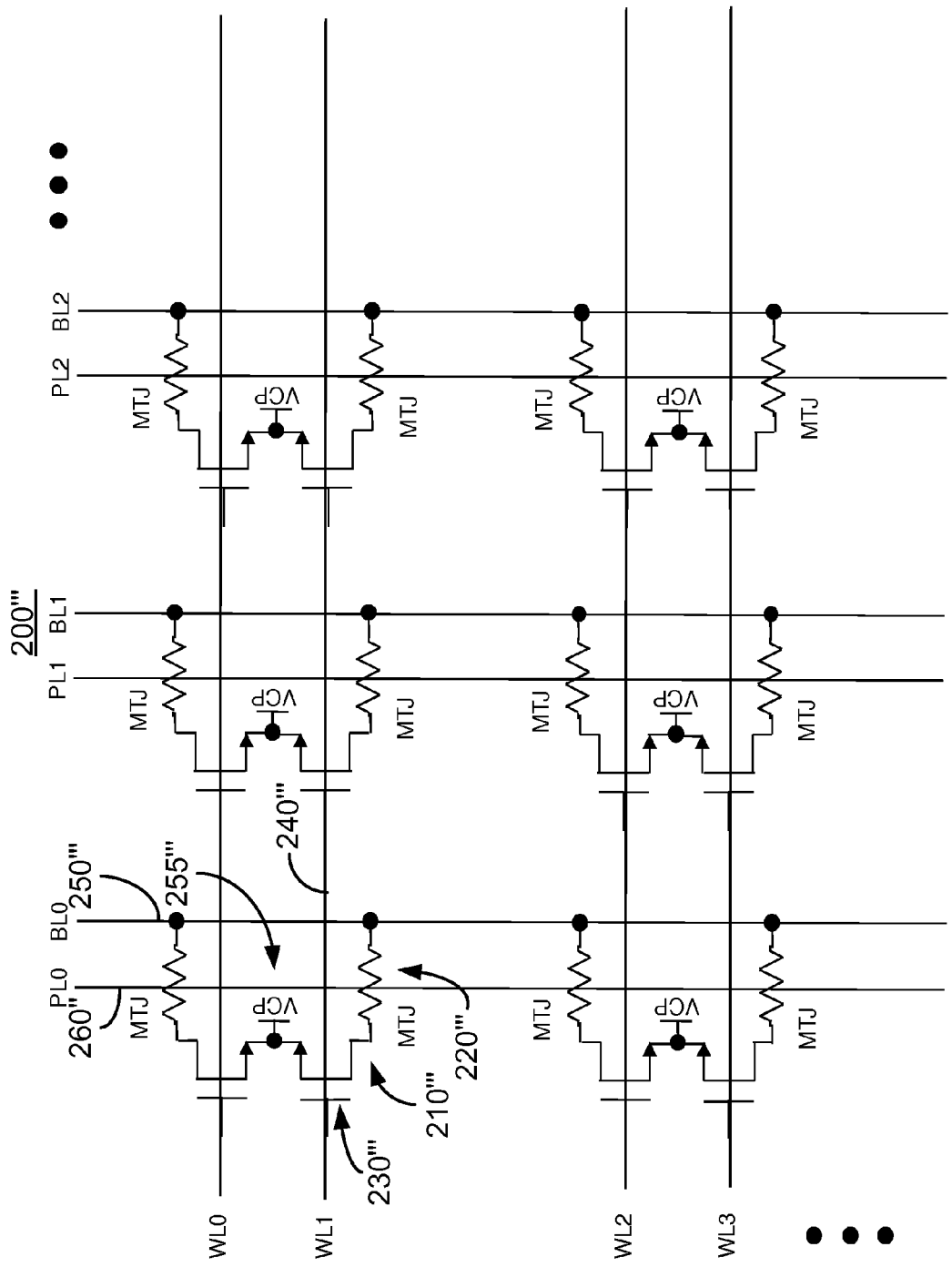
FIG. 14 is a diagram of depicting a portion of an exemplary embodiment of another magnetic memory employing the spin transfer effect.

FIG. 14 is a diagram of depicting a portion of another exemplary embodiment of another magnetic memory 200'" employing the spin transfer effect. FIG. 14 depicts a circuit diagram of one embodiment of a magnetic memory 200'" employing preset lines. The magnetic memory 200'" may be analogous to the magnetic memory 200, 200', 200", 200", 100, 100', 100", and/or 100'". The memory 200'" is described in the context of specific structures, numbers of components, and types of components, other structures, other components, other numbers of components or some combination thereof may be used. The memory 200'" includes magnetic storage cells 210'", magnetic elements 220'", selection devices 230'", word lines 240'", bit lines 250'", preset lines 260'", and grounds (not shown) that may correspond to the storage cells 110/110'/110"/110'"/210/210'/210", the magnetic elements 120/120'/120"/120'"/220/220'/220", the selection devices 130/130'/130"/130'"/230/230'/230", word lines 140/140'/140"/140'"/240/240'/240", the bit lines 150/150'/150"/150'"/250/250'/250", and the preset lines 160/160'/160"/160'"/260/260'/260". However, in other embodiments, the storage cells 210'", magnetic elements 220'" employing spin transfer, selection devices 230'", word lines 240'", bit lines 250'", and preset lines 260'" may correspond to other storage cells, magnetic elements, selection devices, word lines, bit lines, and preset lines. In the embodiment shown, the preset lines 260'" are depicted as parallel to the bit lines 250'". This may be similar to the memory 100" in which preset line 160" is parallel to the bit line 150". In addition, although not shown as connected, the preset lines 260'" may be connected. For example, this may occur in the case in which the layout does not accommodate all metal lines having the critical dimension and/or critical pitch. In some such embodiments, the preset lines 260'" may be in the second or third level metal lines which have a wider pitch and thus be considered connected. However, in another embodiment, the preset lines 260''' may be connected for another reason. Also shown are common voltage planes 255''' that are analogous to the common voltage planes 255'.

The magnetic memory 200''' functions in an analogous manner to the magnetic memories 100/100'/100"/100'''/200. Thus, one or more of the benefits of the magnetic memories 100/100'/100"/100'''/200 may be achieved. Thus, performance of the magnetic memory 200'' may be improved. Finally, note that although different aspects of the magnetic memories 100, 100', 100", 100''', 200, 200', 200", and 200'' are depicted and discussed, other embodiments may include various features of one or more of the magnetic memories 100, 100', 100", 100''', 200, 200', 200", and 200''. Consequently, various combinations of the benefits of the magnetic memories 100, 100', 100", 100''', 200, 200', 200", and 200'' may be achieved.

Figure 15:
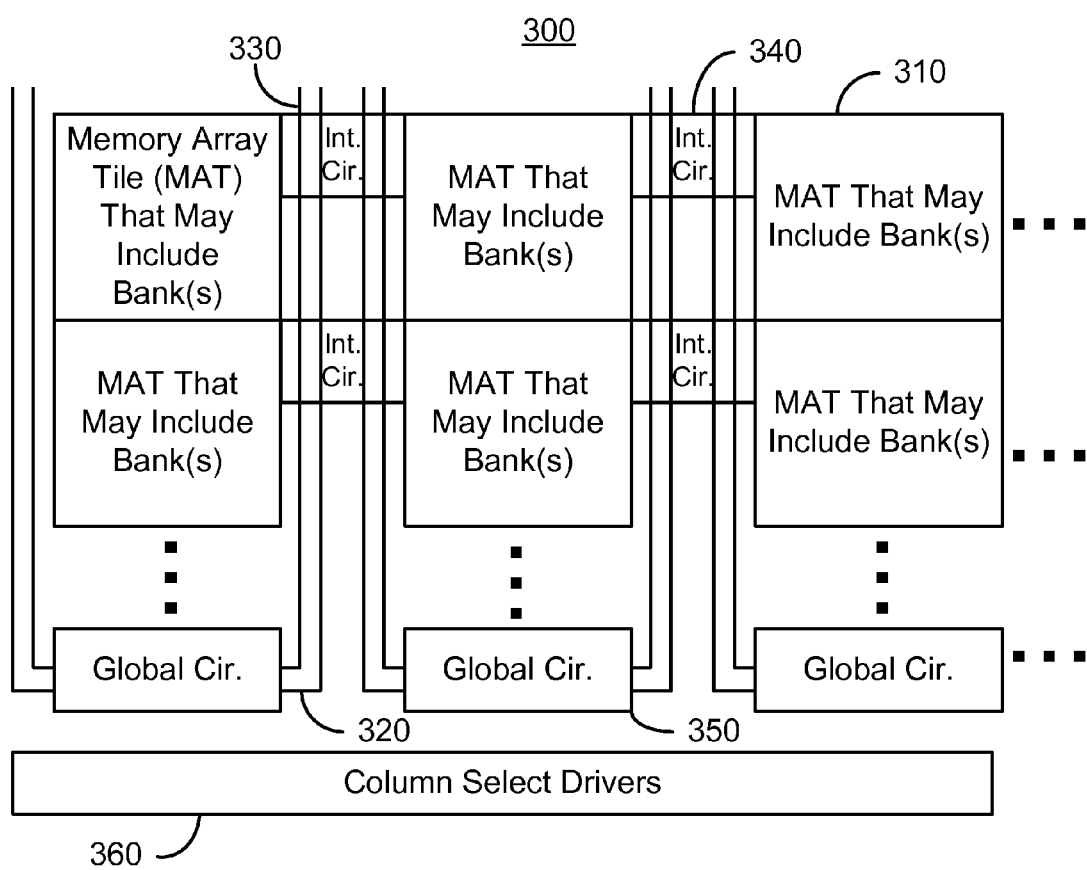
FIG. 15 is a diagram of depicting a portion of an exemplary embodiment of a hierarchically organized magnetic memory employing the spin transfer effect.

FIG. 15 is a diagram of an exemplary embodiment of a portion of a magnetic memory 300 employing the spin transfer effect. The magnetic memory 300 includes memory array tiles (MATs) 310, global circuitry bit lines 320, global word lines 330, intermediate circuitry 340, global circuitry 350, and column select drivers 260. Although particular numbers of global bit lines 320, global word lines 330, intermediate circuitry 340, global circuitry 350, and column select drivers are shown, As can be seen in FIG. 15, the combination of MAT 310, global bit lines 320, global write lines 330, intermediate circuitry 340, and global circuitry 350 may be repeated to scale the magnetic memory 300 up to provide storage of a greater amount of data. For example, in the embodiment shown in FIG. 15, the intermediate circuitry 340 controls writing operation(s) in the MAT 310 to its left and/or right.

In the memory 300 depicted, six MATs 310 are shown. However, the memory 100 may include another number of MATs 310. In addition, the memory 300 may be segregated into sub-arrays. In one embodiment, a sub-array includes eight MATs 310 and local decoding circuitry, such as column select circuits (not explicitly shown), which may be part of the intermediate circuitry 340. However, other configurations may be possible.

Each MAT 310 is where data is actually stored. For clarity, only one MAT 310 is labeled with numeral "310". Each MAT includes multiple storage cells (not explicitly shown) that may be arranged in an array, bit lines, word lines, and preset lines. More specifically, each MAT 310 may include the memories 100, 100', 100", 100''', 200, 200', 200", and/or 200''. Thus, the benefit of an architecture that utilizes preset lines 160, 160', 160", 160''', 260, 260', 260" and/or 260''' may be achieved. Further, in some embodiments, each MAT 310 might be arranged in one or more banks. However, in other embodiments, the MAT 310 need not be associated with banks.

Intermediate circuitry 340 controls read operations and write operations within the corresponding MATs 310. For example, the intermediate circuitry 340 may include local decoding circuitry (not shown in FIG. 15) and drive-sense circuitry (not shown in FIG. 15). Decoding circuitry may allow for selection of specific MAT(s) 310 as well as individual word lines (not shown in FIG. 15) and bit lines (not shown in FIG. 15), and thus selected storage cells within the MAT(s) 310. Write circuitry may be used to drive write currents, preset currents, and otherwise control write operations within a MAT 310. Similarly, read circuitry may drive a read current, receive an output sense current from the MAT 310 being read, and/or otherwise control read operations in the corresponding MAT(s) 310.

The global bit lines 320 and global write lines 330 may be used to select between MATs 310. Thus, different MATs 310 may be read or written to based on enabling and disabling of the global bit lines 320 and global write lines 330. The global circuitry 350 is also used for selecting and driving a portion of the global bit lines 320 and a portion of the global write lines 330 for the read operations and the write operations. In other words, the global circuitry may selectively enable/disable portions of the bit lines word lines, and preset lines within the MATs 310.

The memory 300 is organized in a modular, hierarchical architecture. As a result, larger memories may be built by adding one or more of the modules 310, 3, 330, 340, 350 and 360. The memory 300 may thus be scalable to larger, more dense memories. Further, the global bit lines 320 and global write lines 330 may have a lower resistance than the bit lines (not shown in FIG. 15). The global bit lines 320 may come from a read mux (shown in FIGS. 16 and 17), read pre-amplifier (shown in FIG. 18), global write lines driver, or local write drivers which may drive both bit-lines and source-lines or in some cases, only bit-lines within each MAT 310. Thus, the parasitic resistance may be reduced and/or limited to the MATs 310. Array efficiency may thus be increased. Sense amplifiers may be located in the global circuitry 350 and thus de-coupled from the local bit lines. Multiple MATs 310 may also share a set of global sense amplifiers and global writer drivers in the global circuitry 350. In some embodiments, the array size may thus be reduced. Use of the intermediate circuitry 340 for sensing signals, driving currents, and decoding within the MATs may reduce read and/or write penalties. Consequently, the memory 300 may be usable in higher density memories. Consequently, the benefits of the memories 100,100', 100", 100''', 200, 200', 200", and/or 200''' may be combined with the scalability of the hierarchical memory 300. Performance of the memory 300 may be improved.

Figure 16:
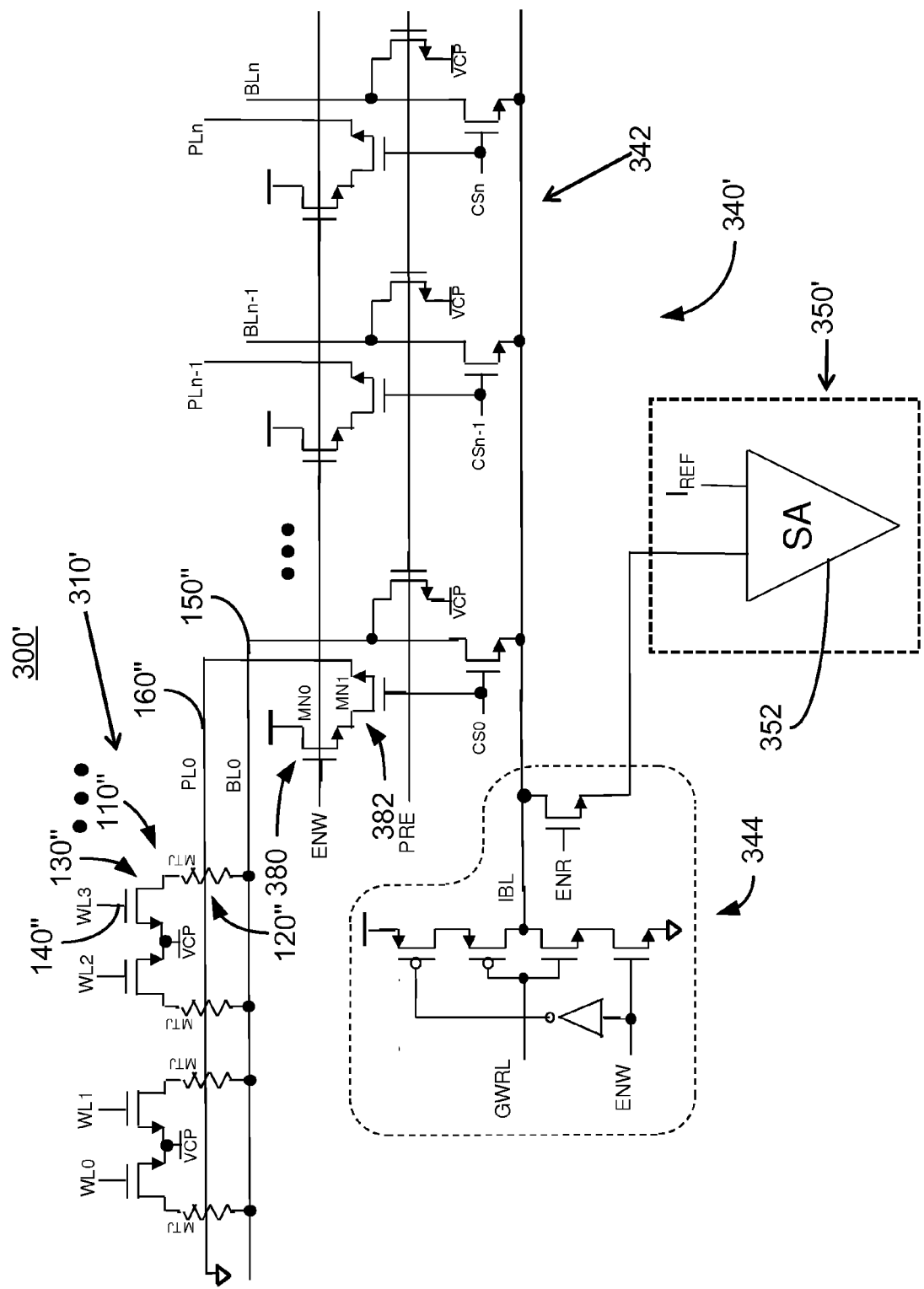
FIG. 16 is a diagram of depicting a portion of another exemplary embodiment of a hierarchically organized magnetic memory employing the spin transfer effect.

FIG. 16 is a diagram of depicting a portion of another exemplary embodiment of a hierarchically organized magnetic memory 300' employing the spin transfer effect. The magnetic memory 300' may be part of the magnetic memory 300. The memory 300' depicts one embodiment of the circuitry used in enabling a preset line. For clarity, the memory 300', particularly the portion of the MAT 310' shown, is assumed to be analogous to part of the memory 100" and is thus labeled similarly. However, in other embodiments, the memory 300' may be used in connection with another memory, such as the memory 100, 100', 100''', 200, 200', 200", and/or 200'''. The memory 300' is also described in the context of specific structures, numbers of components, and types of components, other structures, other components, other numbers of components or some combination thereof may be used.

The MAT 310', portions 342 and 344 of intermediate circuitry 340', and a portion of the global circuitry 350' are shown. The region 344 is used to drive a portion of the bit lines 150". In addition to circuitry that might otherwise be used to drive bit lines 150" and word lines 140" in a hierarchical memory 300', additional devices 380 and 382 may be used to drive the preset line 160" and time the preset line 160" with a write pulse used in programming the storage cell 110". In the embodiment shown, the devices 380 and 382 are n-channel transistors. However, other analogous devices might be used.

In a precharge cycle, a PRE (precharge) signal may be used to precharge bit lines 150" and source lines 255 to an initial voltage (or inactive cycle). In some cases, bit lines 150" and/or source lines 255 are pre-charged to ground. In other cases, bit lines 150" and/or source lines 255 are precharged to voltages other than ground, such as Vbb (−0.8v), Vcp (Vdd/2), or other voltages. In some embodiments, PRE signal 402" goes low to turn off the pre-charge transistors at the beginning of the write cycle. In some embodiments, word lines 140" and column select lines are inactive in order to precharge the bit lines 150" and source lines 255. Otherwise, the memory cells maybe disturbed and data loss may occur. In the memory 300', a common plane (VCP) analogous to the common plane 255/255" is used. As discussed below, the memory 300' uses the PRE signal to time the preset lines. However, in other embodiments, other control schemes may be used. An ENW (write enable) signal is used to enable the device 380, which enables the preset line 160". The column select signal for the particular column, CS0 enables the device 382. Thus, the preset current may be driven through the preset line 160". The decoding for such an operation may be performed using available signals CS, PRE and ENW and two additional devices 380 and 382 per preset line 160". Thus, the benefits of the hierarchical memory 300 in combination with the benefits of one or more of the memories 100, 100', 100", 100''', 200, 200', 200", and 200''' may be achieved.

Figure 17:
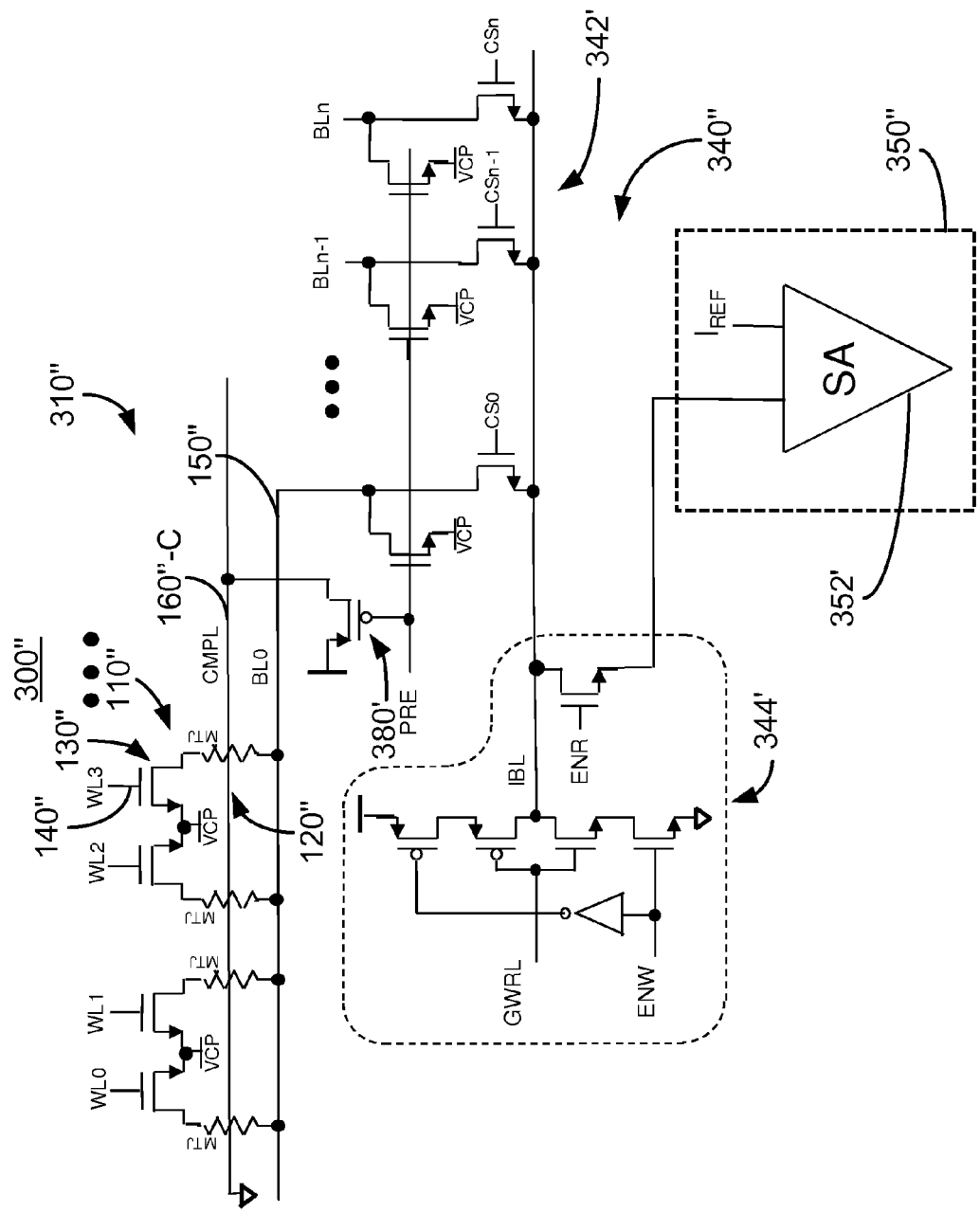
FIG. 17 is a diagram of depicting a portion of another exemplary embodiment of a hierarchically organized magnetic memory employing the spin transfer effect.

FIG. 17 is a diagram of depicting a portion of another exemplary embodiment of a hierarchically organized magnetic memory 300" employing the spin transfer effect. The magnetic memory 300" may be part of the magnetic memory 300. The memory 300" depicts another embodiment of the circuitry used in enabling a preset line. For clarity, the memory 300", particularly the portion of the MAT 310" shown, is assumed to be analogous to part of the memory 100" and is thus labeled similarly. However, a complement 160"-C to the preset line 160" depicted in FIG. 9 is shown. Further, in other embodiments, the memory 300" may be used in connection with another memory, such as the memory 100, 100', 100''', 200, 200', 200", and/or 200'''. The memory 300" is a described in the context of specific structures, numbers of components, and types of components, other structures, other components, other numbers of components or some combination thereof may be used.

The MAT 310", portions 342' and 344' of intermediate circuitry 340", and a portion of the global circuitry 350" are shown. The region 344' is used to drive a portion of the bit lines 150". In addition to circuitry that might otherwise be used to drive bit lines 150" and word lines 140" in a hierarchical memory 300", additional device 380' may be used to drive the preset line complement 160"-C and time the preset line complement 160"-C with a write pulse used in programming the storage cell 110". In the embodiment shown, the device 380' is a p-channel transistor. However, other analogous devices might be used.

In a pre-charge operation, a PRE signal is used to precharge bit lines 150" to a common voltage (e.g. ground). In the memory 300", a common plane (VCP) analogous to the common plane 255'/255" is used. Thus, the PRE signal precharges all bit lines 160" to the desired level, usually to ground or in other embodiments, other voltages, such as to Vbb, Vcp, or another voltage. Data are written by selecting the appropriate WL and CS. The PRE signal may also be used to control the p-channel device 380', that selectively enables or disables the complement of the precharge line 160"-C. Thus, the preset current may be selectively driven through the preset line complement 160"-C. The decoding for such an operation may be performed using available signals PRE and an additional device p-channel device 380' per preset line complement 160"-C. Thus, the benefits of the hierarchical memory 300 in combination with the benefits of one or more of the memories 100, 100', 100", 100''', 200, 200', 200", and 200''' may be achieved.

Figure 18:
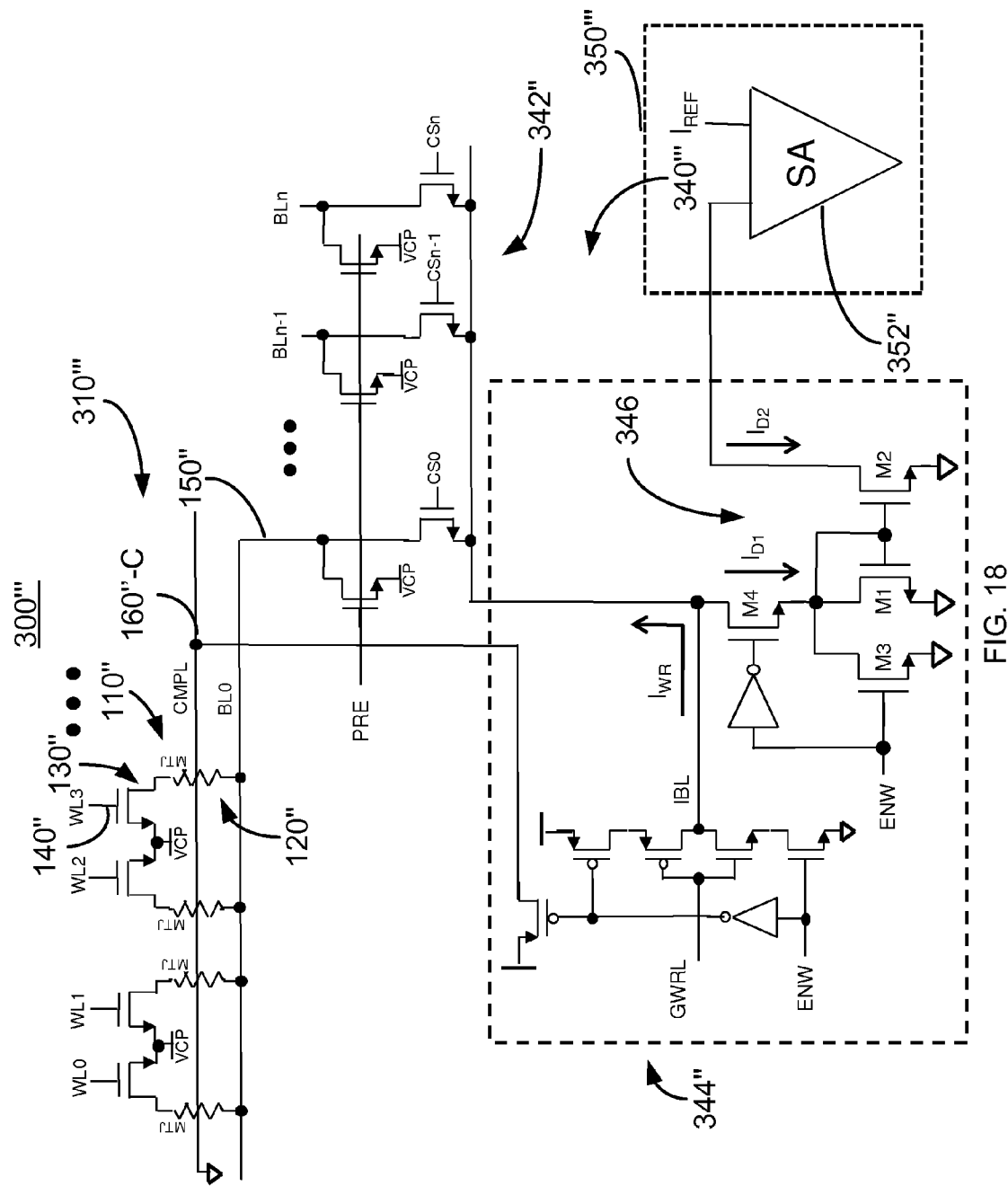
FIG. 18 is a diagram of depicting a portion of another exemplary embodiment of a hierarchically organized magnetic memory employing the spin transfer effect.

FIG. 18 is a diagram of depicting a portion of another exemplary embodiment of a hierarchically organized magnetic memory 300''' employing the spin transfer effect. The magnetic memory 300''' may be part of the magnetic memory 300. The memory 300''' depicts another embodiment of the circuitry used in enabling a preset line. For clarity, the memory 300''', particularly the portion of the MAT 310''' shown, is assumed to be analogous to part of the memory 100" and is thus labeled similarly. However, a complement 160"-C to the preset line 160" depicted in FIG. 9 is shown. Further, in other embodiments, the memory 300''' may be used in connection with another memory, such as the memory 100, 100', 100''', 200, 200', 200", and/or 200'''. The memory 300''' i also described in the context of specific structures, numbers of components, and types of components, other structures, other components, other numbers of components or some combination thereof may be used.

The MAT 310''', portions 342" and 344" of intermediate circuitry 340''', and a portion of the global circuitry 350''' are shown. The region 344" is used to drive a portion of the bit lines 150". In addition, the write driver in region 344" may be used to drive the preset line complement 160"-C and time the preset line complement 160"-C. Also shown in region 344''' is a current mirror 346 that may be used in amplifying the read signal provide to the sense amplifier 352" in the region 350'''.

In a pre-charge operation, a PRE (precharge) signal is used to pre-charge bit lines 150". In the memory 300''', a common plane (VCP) analogous to the common plane 255/255" is used. Thus, the PRE signal precharges the bit line 160" to Vcp. The write driver of the region 344" may also provide a signal to the preset line complement 160"-C. Thus, the benefits of the hierarchical memory 300 in combination with the benefits of one or more of the memories 100, 100', 100", 100''', 200, 200', 200", and 200''' may be achieved.

Figure 19:
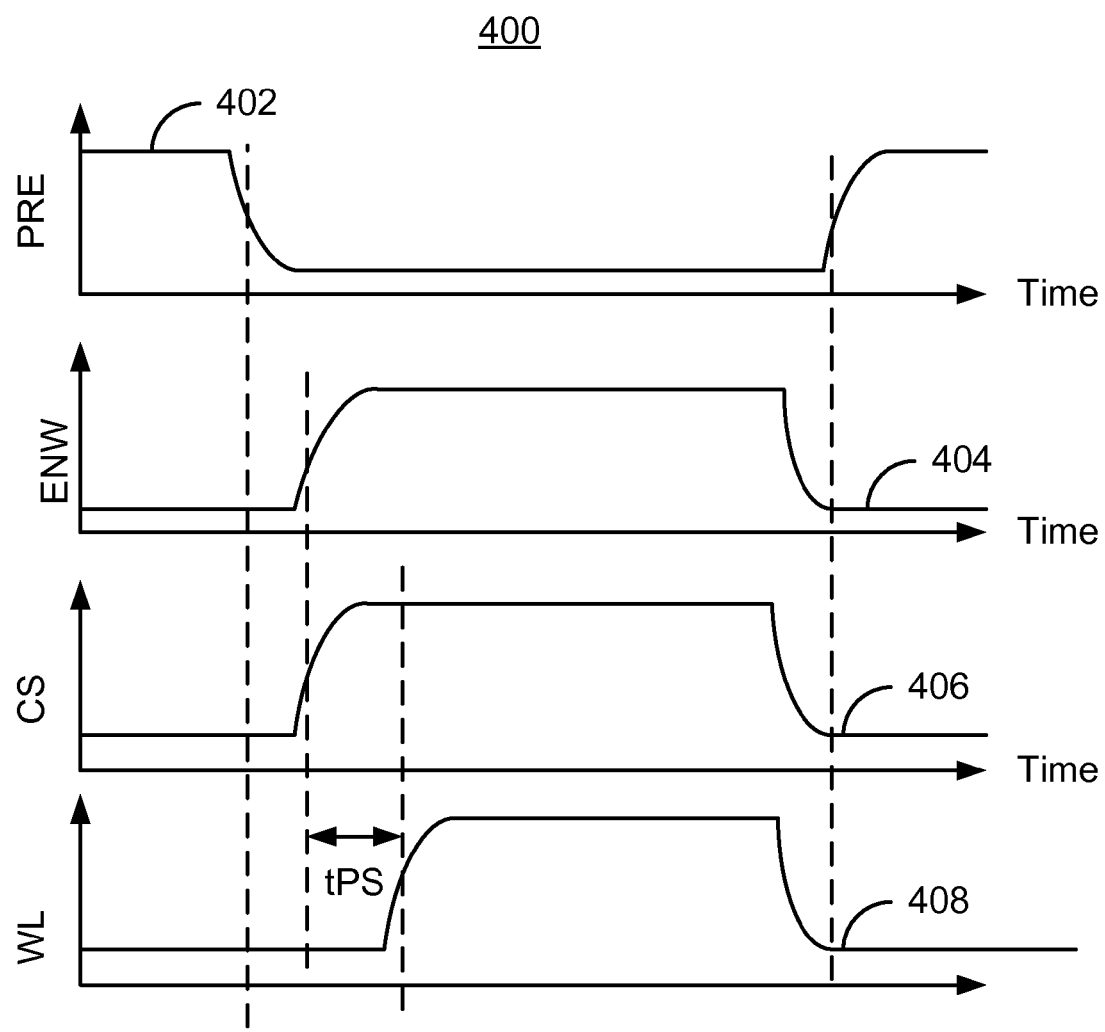
FIGS. 19-20 depict exemplary embodiments of timing diagrams for a magnetic memory employing the spin transfer effect and using preset lines.
Figure 20:
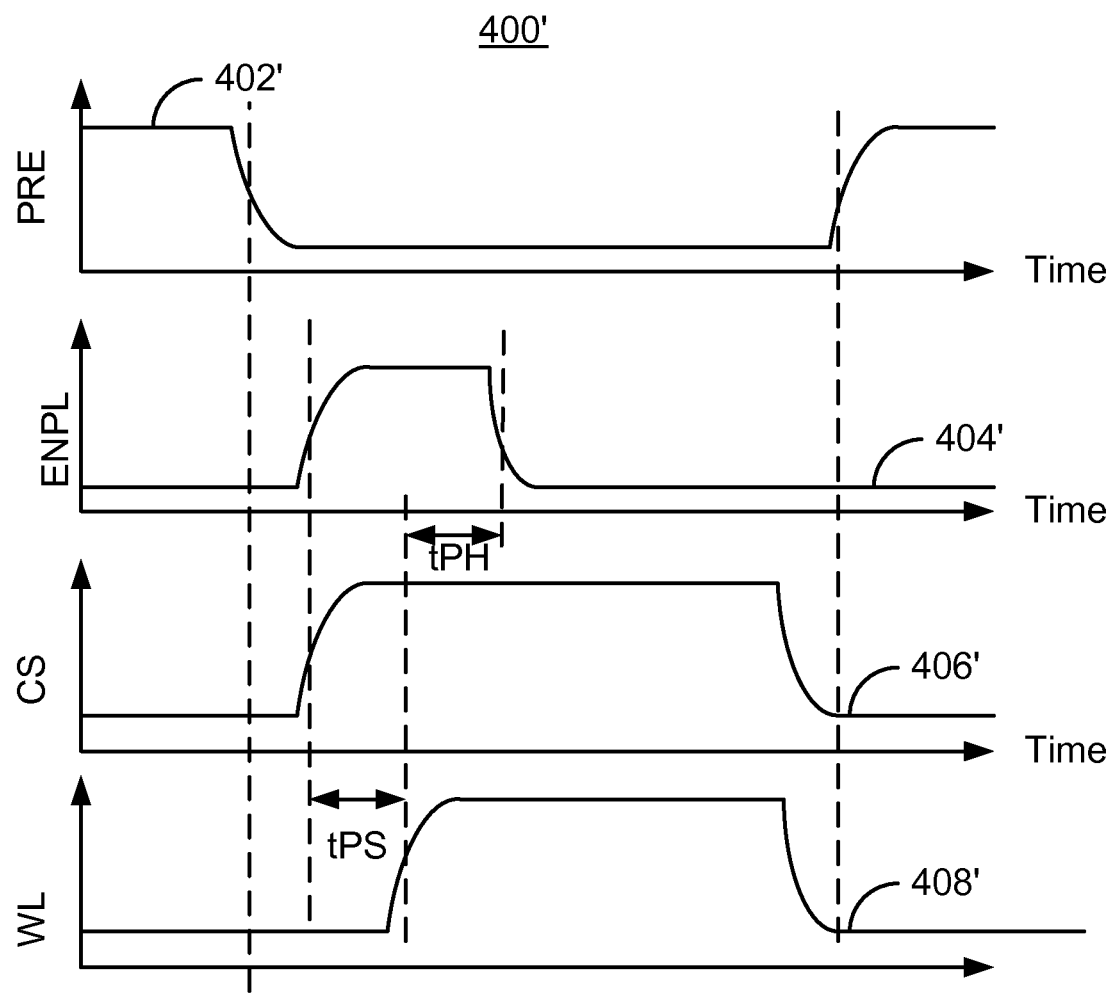

For example, FIGS. 19 and 20 depict exemplary embodiments of timing diagrams for a magnetic memory employing the spin transfer effect and using preset lines. FIGS. 19 and 20 are thus described in the context of the magnetic memory 300'. However, analogous timing diagrams may be used for other memories such as the memories 100, 100', 100", 100''', 200, 200', 200", 200''', 300 and 300". FI timing diagram 400 that uses existing decoding and control signals. Thus, PRE signal 402, ENW signal 404, CS signal 406, and WL signal 408 are used. The PRE signal 402 is used in precharging a bit line 150". In embodiments containing a source line, the PRE signal 402 may also be used in precharging source lines, such as the source line 255. The ENW signal 404 is a write enable signal. The CS signal 406 is a column select signal. The WL signal 408 enables the corresponding word line, allowing a write current to flow through the magnetic element 120". In the timing diagram 400, the precharge signal PRE 402 starts with the bit line precharged. The precharge signal PRE 402 then releases the bit line 150" (pre-charge is disabled/PRE 402 goes low). The ENW signal 404 and CS signal 406 may then enable devices 380 and 382, respectively. Thus, the preset current may be driven through the preset line 160" and a magnetic field generated at the magnetic element 120". At some small time, tPS, later, the WL signal 408 enables the word line 140". Thus, a write current flows through the magnetic element 120". In the embodiment shown, the preset current and write current are turned off at substantially the same time. Using the timing shown in FIG. 19, the magnetic element 120" may be written while the magnetic moment of the free layer is oriented by a magnetic field generated by the preset current. This write operation, including the preset line, may be controlled using already available signals.

FIG. 20 depicts timing diagram 400' that uses existing decoding and control signals PRE 402', CS 406', and WL 408' plus an additional enable preset line signal ENPL 404'. In the timing diagram 400', the precharge signal PRE 402' precharges the bit line. In embodiments containing a source line, the PRE signal 402' may also be used in precharging source lines, such as the source line 255. The ENPL signal 404' enables the preset line 160". The CS signal 406' is a column select signal. The WL signal 408' enables the corresponding word line, allowing a write current to flow through the magnetic element 120". The PRE signal 402' starts high, but is then driven low to release the bit line 150". The ENPL signal 404' then enables the preset line 160". The CS signal 406' enables the device 382 or analogous device. Thus, the preset current may be driven through the preset line 160" and the corresponding magnetic field is generated. At some small time, tPS, later, the WL signal 408 enables the word line 140". Thus, the write current may flow through the magnetic element 120". At a later time, tPH, the ENPL signal 404' is driven low and the preset current turned off. In the embodiment shown, the preset current may be turned off before the write current is no longer driven through the magnetic element. However, the magnetic element 120 may still be written while the magnetic moment of the free layer is oriented by a magnetic field generated by the preset current. Using the timing shown in FIG. 20, the magnetic element 120" may be written while the magnetic moment of the free layer is oriented by a magnetic field generated by the preset current. The control circuit for the ENPL signal 404' may be as follows: the rising edge of ENPL signal 404' may be controlled by PRE signal 402' going low. The falling edge of ENPL singal 404' may be controlled by a delayed signal from the WL 408' signal going high. The delay from the WL 406' may be zero or any fraction of the WL pulse width. This write operation, including the preset line, may be controlled using already available signals plus an additional ENPL signal 404' for the preset line. As a result, the duration of the preset current may be reduced or otherwise changed with respect to the write current.

Using the method 500, the memory 100, 100', 100", 100''', 200, 200', 200", 200''300, 300', 300", and/or 300''' may be provided. Consequently, the benefits of the hierarchical architecture of the memories 100, 100', 100", 100''', 200, 200', 200", 200''300, 300', 300", and/or 300''' might be achieved.

A method and system for a magnetic memory has been disclosed. The method and system has been described in accordance with the embodiments shown, and there could be variations to the embodiments, and any variations would be within the spirit and scope of the present invention. Accordingly, many modifications may be made by one of ordinary skill in the art without departing from the spirit and scope of the appended claims.

We claim:

1. A magnetic memory comprising:
a plurality of magnetic storage cells, each of the plurality of magnetic storage cells including at least one magnetic element;
a plurality of bit lines coupled with the plurality of magnetic storage cells and being configured to drive at least one write current through at least one selected storage cell of the plurality of magnetic storage cells to write to the at least one selected storage cell;
a plurality of preset lines for driving at least one preset current in proximity to but not through the at least one selected storage cell, the at least one preset current generating at least one magnetic field to orient the at least one magnetic element of the at least one selected storage cell in a direction;
a plurality of word lines coupled with the plurality of magnetic storage cells and configured to enable the at least one selected storage cell for writing;
wherein either the plurality of bit lines resides between the plurality of preset lines and the plurality of storage cells or the plurality of preset lines resides between the plurality of storage cells and on a storage cell side of the plurality of bit lines;
wherein the plurality of preset lines is configured to start generating the at least one magnetic field before at least one write current starts being driven through the at least one selected storage cell, to stop generating the at least one magnetic field before the at least one write current starts being driven through the at least one storage cell and such that the at least one selected magnetic element has insufficient time to relax to an equilibrium state between the at least one magnetic field stopping being generated and the at least one write current starts being driven through the at least one selected storage cell.

2. The magnetic memory of claim 1 wherein the plurality of bit lines are between the plurality of preset lines and the plurality of storage cells.

3. The magnetic memory of claim 2 wherein the plurality of bit lines is substantially parallel to the plurality of preset lines.

4. The magnetic memory of claim 1 wherein each of the at least one magnetic element has an easy axis and wherein the at least one magnetic field is substantially parallel to the easy axis.

5. The magnetic memory of claim 1 wherein the plurality of preset lines is configured to start generating the at least one magnetic field not after the at least one write current starts to be driven through the at least one selected storage cell.

6. The magnetic memory of claim 1 wherein the plurality of preset lines is configured such that the at least one preset current is not more than five milliamps.

7. The magnetic memory of claim 6 wherein the plurality of preset lines is configured such that the at least one preset current is not more than two milliamps.

8. The magnetic memory of claim 1 wherein the plurality of magnetic storage cells, the plurality of bit lines, the plurality of preset lines and the plurality of word lines are arranged into a plurality of memory array tiles (MATs), each of the plurality of MATs including a portion of the plurality of magnetic storage cells, a portion of the plurality of bit lines, a portion of the plurality of preset lines, and a portion of the plurality of word lines, the magnetic memory further comprising:
intermediate circuitry for controlling read operations and write operations within the plurality of MATs, the intermediate circuitry further including at least one current mirrored preamplifier for amplifying a read signal from the portion of the plurality of MATs to provide an amplified read signal;
a plurality of intermediate read drivers, each of the plurality of intermediate read drivers for controlling read operations in a third portion of the plurality of MATs, the intermediate read drivers further including;
a plurality of intermediate write drivers, each of the plurality of write drivers for driving the write operations in a fourth portion of the plurality of MATs;
local decoding circuitry for selecting at least one selected MAT of the plurality of MATs and at least one of the storage cells in the at least one selected MAT;
a plurality of global bit lines, each of the global bit lines corresponding to a first portion of the plurality of MATs;
a plurality of global word lines, each of the global word lines corresponding to a second portion of the plurality of MATs; and global circuitry for selecting and driving a portion of the plurality of global bit lines and a portion of the plurality of global word lines for the read operations and the write operations, the global circuitry including at least one sense amplifier for receiving an amplified read signal from the preamplifier and providing an output corresponding to at least one state of at least one of the plurality of storage cells in the portion of the plurality of MATs.

9. The magnetic memory of claim 1 further comprising:
a common voltage plane coupled with the plurality of memory cells, the at least one write current flowing between the common voltage plane, the at least one magnetic element, and at least one of the plurality of bit lines.

10. The magnetic memory of claim 1 wherein the at least one write current has a magnitude sufficient to write to the at least one selected storage cell only in combination with the at least one preset current.

11. A magnetic memory comprising:
a plurality of magnetic storage cells, each of the plurality of magnetic storage cells including at least one magnetic element;
a plurality of bit lines coupled with the plurality of magnetic storage cells and being configured to drive at least one write current through at least one selected storage cell of the plurality of magnetic storage cells to write to the at least one selected storage cell;
a plurality of preset lines for driving at least one preset current in proximity to but not through the at least one selected storage cell, the at least one preset current generating at least one magnetic field to orient the at least one magnetic element of the at least one selected storage cell in a direction;
a plurality of word lines coupled with the plurality of magnetic storage cells and configured to enable the at least one selected storage cell for writing;
wherein either the plurality of bit lines resides between the plurality of preset lines and the plurality of storage cells or the plurality of preset lines resides between the plurality of storage cells and on a storage cell side of the plurality of bit lines;
wherein each of the plurality of preset lines is along a preset line direction and wherein each of the plurality of preset line extends over at least two of the plurality of storage cells in a direction substantially perpendicular to the preset line direction.

12. The magnetic memory of claim 11 wherein the plurality of preset lines is configured to start generating the at least one magnetic field before the at least one write current starts being driven through the at least one selected storage cell.

13. The magnetic memory of claim 12 wherein the plurality of preset lines is configured to stop generating the at least one magnetic field after the at least one write current starts being driven through the at least one selected storage cell.

14. The magnetic memory of claim 13 wherein the plurality of preset lines is configured to stop generating the at least one magnetic field before the at least one write current reaches a maximum value in the at least one selected storage cell.

15. The magnetic memory of claim 12 wherein the plurality of preset lines is configured to stop generating the at least one magnetic field while the at least one write current is being driven through the at least one selected storage cell.

16. The magnetic memory of claim 11 wherein the plurality of bit lines are substantially perpendicular to the plurality of preset lines.

17. A magnetic memory comprising
a plurality of magnetic storage cells, each of the plurality of magnetic storage cells including at least one magnetic element;
a plurality of bit lines coupled with the plurality of magnetic storage cells and being configured to drive at least one write current through at least one selected storage cell of the plurality of magnetic storage cells to write to the at least one selected storage cell;
a plurality of preset lines for driving at least one preset current in proximity to but not through the at least one selected storage cell, the at least one preset current generating at least one magnetic field to orient the at least one magnetic element of the at least one selected storage cell in a direction;
a plurality of word lines coupled with the plurality of magnetic storage cells and configured to enable the at least one selected storage cell for writing;
wherein either the plurality of bit lines resides between the plurality of preset lines and the plurality of storage cells or the plurality of preset lines resides between the plurality of storage cells and on a storage cell side of the plurality of bit lines;
wherein each of the at least one magnetic element has an easy axis and wherein the at least one magnetic field is substantially perpendicular to the easy axis, and wherein each of the plurality of preset lines is along a preset line direction and wherein each of the plurality of preset line extends over at least two of the plurality of storage cells in a direction substantially perpendicular to the preset line direction.

18. A method for programming magnetic memory including a plurality of magnetic storage cells, a plurality of bit lines, and a plurality of storage cells, each of the plurality of magnetic storage cells including at least one magnetic element programmable by at least one write current driven through the at least one magnetic element, the plurality of bit lines being coupled with the plurality of magnetic storage cells and configured to drive the at least one write current through at least one selected storage cell to write to the at least one selected storage cell, the method comprising:
driving at least one preset current in at least one preset line of the plurality of preset lines in proximity to but not through at least one selected storage cell, the at least one preset current generating at least one magnetic field to orient the at least one magnetic element of the at least one selected storage cell in a direction, at least one of the plurality of bit lines residing between the plurality of preset lines and the plurality of storage cells and the plurality of preset line residing between the plurality of storage cells and on a storage cell side of the plurality of bit lines, the step of driving the at least one preset current further including terminating the at least one preset current; and
driving the at least one write current through the at least one selected storage cell after the present current starts being driven through the at least one preset lines, the step of driving the at least one write current commencing after the step of terminating the at least one preset current completes and such that the at least one selected magnetic element has insufficient time to relax to an equilibrium state before the at least one write current starts being driven through the at least one selected storage cell.

19. The method of claim 18 wherein the step of driving the at least one preset current further includes:

starting to drive the preset current to generate the at least one magnetic field not after the at least one write current starts to be driven through the at least one selected storage cell.

20. The method of claim 18 step of driving the at least one preset current further includes:
    starting to drive the at least one preset current to generate the at least one magnetic field before the at least one write current starts being driven through the at least one selected storage cell.

21. The method of claim 18 wherein the at least one preset current is not more than five milliamps.

22. The method of claim 18 wherein the at least one preset current is not more than two milliamps.

23. The method of claim 18 wherein the at least one write current has a magnitude sufficient to write to the at least one selected storage cell only in combination with the at least one preset current.

24. A method for programming magnetic memory including a plurality of magnetic storage cells, a plurality of bit lines, and a plurality of storage cells, each of the plurality of magnetic storage cells including at least one magnetic element programmable by at least one write current driven through the at least one magnetic element, the plurality of bit lines being coupled with the plurality of magnetic storage cells and configured to drive the at least one write current through at least one selected storage cell to write to the at least one selected storage cell, the method comprising:
    driving at least one preset current in at least one preset line of the plurality of preset lines in proximity to but not through at least one selected storage cell, the at least one preset current generating at least one magnetic field to orient the at least one magnetic element of the at least one selected storage cell in a direction, at least one of the plurality of bit lines residing between the plurality of preset lines and the plurality of storage cells and the plurality of preset line residing between the plurality of storage cells and on a storage cell side of the plurality of bit lines;
    driving the at least one write current through the at least one selected storage cell after the present current starts being driven through the at least one preset lines;
    wherein each of the plurality of preset lines is along a preset line direction and wherein each of the plurality of preset lines extends over at least two of the plurality of storage cells in a direction substantially perpendicular to the present line direction such that the at least one magnetic field orients the magnetic element of at least two selected storage cells.

25. The method of claim 24 wherein the step of driving the at least one preset current further includes:
    terminating the at least one preset current after the at least one write current starts being driven through the at least one selected storage cell.

26. The method of claim 24 wherein step of driving the at least one preset current further includes:
    terminating the at least one preset current and the at the least one magnetic field before the at least one write current reaches a maximum value in the at least one selected storage cell.

27. The method of claim 24 wherein the plurality of bit lines are substantially perpendicular to the plurality of preset lines.

* * * * *